United States Patent
Goto et al.

(10) Patent No.: US 11,221,133 B2
(45) Date of Patent: Jan. 11, 2022

(54) LIGHTING DEVICE WITH ELECTRIC POWER GENERATION FUNCTION

(71) Applicant: GCE INSTITUTE INC., Tokyo (JP)

(72) Inventors: Hiroshi Goto, Tokyo (JP); Minoru Sakata, Tokyo (JP)

(73) Assignee: GCE INSTITUTE INC., Tokyo (JP)

( * ) Notice: Subject to any disclaimer, the term of this patent is extended or adjusted under 35 U.S.C. 154(b) by 0 days.

(21) Appl. No.: 17/286,871

(22) PCT Filed: Oct. 10, 2019

(86) PCT No.: PCT/JP2019/040019
§ 371 (c)(1),
(2) Date: Apr. 20, 2021

(87) PCT Pub. No.: WO2020/085102
PCT Pub. Date: Apr. 30, 2020

(65) Prior Publication Data
US 2021/0381685 A1   Dec. 9, 2021

(30) Foreign Application Priority Data

Oct. 22, 2018   (JP) .............................. JP2018-198456

(51) Int. Cl.
*F21V 29/70*   (2015.01)
*F21K 9/232*   (2016.01)
(Continued)

(52) U.S. Cl.
CPC .............. *F21V 29/70* (2015.01); *F21K 9/232* (2016.08); *F21K 9/237* (2016.08); *F21K 9/238* (2016.08); *F21S 9/04* (2013.01); *F21Y 2115/10* (2016.08)

(58) Field of Classification Search
CPC .......... F21V 29/70; F21K 9/238; F21K 9/237; F21K 9/232; F21S 9/04; F21Y 2115/10
See application file for complete search history.

(56) References Cited

U.S. PATENT DOCUMENTS

2003/0184188 A1   10/2003   Kucherov et al.
2010/0073921 A1*   3/2010   Zhou ...................... F21S 9/043
                                                    362/192
(Continued)

FOREIGN PATENT DOCUMENTS

JP   2002540636 A   11/2002
JP   2012099486 A    5/2012
(Continued)

OTHER PUBLICATIONS

International Search Report (ISR) (and English translation thereof) dated Nov. 26, 2019 issued in International Application No. PCT/JP2019/040019.
(Continued)

*Primary Examiner* — Evan P Dzierzynski
(74) *Attorney, Agent, or Firm* — Holtz, Holtz & Volek PC

(57) ABSTRACT

A lighting device includes a light-emitting device, a heat sink having a hollow unit inside, a translucent cover, and a thermoelectric element. The thermoelectric element includes a casing unit having a housing unit, and includes a first electrode unit, a second electrode unit having a work function different from that of the first electrode unit, and a middle unit including nanoparticles having a work function between the work function of the first electrode unit and the work function of the second electrode unit, which are provided inside the housing unit. The casing unit is provided on the inner surface of the hollow unit of the heat sink.

7 Claims, 14 Drawing Sheets

(51) Int. Cl.
*F21K 9/238* (2016.01)
*F21S 9/04* (2006.01)
*F21K 9/237* (2016.01)
*F21Y 115/10* (2016.01)

(56) References Cited

U.S. PATENT DOCUMENTS

| | | |
|---|---|---|
| 2011/0234107 A1 | 9/2011 | Simon et al. |
| 2013/0265767 A1 | 10/2013 | Lang |
| 2014/0321120 A1* | 10/2014 | Pas .......................... A61L 9/03 362/253 |

FOREIGN PATENT DOCUMENTS

| | | |
|---|---|---|
| JP | 2014502015 A | 1/2014 |
| JP | 6147901 B1 | 5/2017 |

OTHER PUBLICATIONS

Written Opinion dated Nov. 26, 2019 issued in International Application No. PCT/JP2019/040019.
International Search Report (ISR) (and English translation thereof) dated Nov. 12, 2019 issued in International Application No. PCT/JP2019/039289.
U.S. Appl. No. 17/282,749, First Named Inventor: Hiroshi Goto; Title: "Light-Emitting Device With Electric Power Generation Function, Lighting Device, and Display Device"; filed Apr. 2, 2021.
Written Opinion dated Nov. 12, 2019 issued in International Application No. PCT/JP2019/039289.

* cited by examiner

LIGHTING DEVICE WITH ELECTRIC POWER GENERATION FUNCTION

TECHNICAL FIELD

The present invention relates to a lighting device with an electric power generation function.

BACKGROUND ART

Recently, the effective use of heat that accompanies the emission of light from light-emitting elements such as LEDs has been drawing attention. For example, patent literature 1 discloses a lighting device that generates electric power by using the heat that accompanies the emission of light from light-emitting elements. The lighting device described in patent literature 1 includes LED elements, thermoelectric elements that generate electric power by creating temperature differences in the thermoelectric elements, and a low-temperature material that creates temperature differences in the thermoelectric elements.

Patent literature 2 discloses a thermoelectric element, which has electrically-insulating spherical nanobeads separating between an emitter-electrode layer and a collector-electrode layer at a submicron interval, in which the work function of the emitter-electrode layer is smaller than the work function of the collector-electrode layer, and in which the space between the electrodes separated by the spherical nanobeads is filled with a metal nanobead dispersion liquid, in which nano-particles having a work function between those of the emitter-electrode layer and the collector-electrode layer, and having a smaller particle diameter than the spherical nanobeads, is dispersed.

CITATION LIST

Patent Literature

Patent Literature 1: Japanese Translation of PCT International Application Publication No. 2014-502015
Patent Literature 2: Japanese Patent No. 6147901

SUMMARY OF INVENTION

Problem to be Solved by the Invention

With the thermoelectric elements described in patent literature 1, a pair of electrodes is provided in a thermoelectric element, one electrode to be heated and the other electrode to be cooled. By creating a difference in temperature between the two electrodes in this way, the thermoelectric element generates electric power.

However, according to patent literature 1, in order to actually generate electric power, besides LED elements and thermoelectric elements, a low-temperature material that creates temperature differences in the thermoelectric elements and a chiller that cools the low-temperature material need to be provided. Consequently, the number of components in the lighting device with an electric power generation function increases, and its manufacturing cost also increases. Furthermore, the fact that the lighting device with an electric power generation function includes LED elements, thermoelectric elements, a low-temperature material and a chiller leads to an increase in size. Moreover, in addition to the LED elements and thermoelectric elements, new areas for providing the low-temperature material and the chiller need to be added in the lighting device with an electric power generation function. This also leads to a further increase in size.

In the thermoelectric element disclosed in patent literature 2, the work function of the emitter-electrode layer is made smaller than the work function of the collector-electrode layer, and the metal nanoparticle dispersion liquid fills the space between the electrodes separated by spherical nanobeads. By this means, the thermoelectric element can generate electric power without creating temperature differences in the thermoelectric element. Patent literature 2 discloses the structure of such a thermoelectric element. However, patent literature 2 does not suggest that the thermoelectric element can be provided together, while preventing an increase of the manufacturing cost of the lighting device, and preventing an increase of size.

The present invention has been made in view of the above circumstances, and it is therefore an object of the present invention to provide a lighting device with an electric power generation function, that is capable of preventing an increase of the manufacturing cost and an increase of size.

Means for Solving the Problems

The lighting device with an electric power generation function according to the first invention is a lighting device with an electric power generation function, having an LED element to convert electric energy into light energy, and a thermoelectric element to convert thermal energy released from the LED element into electric energy, the lighting device having a light-emitting device, including a thermal conductive LED board, including a thermal conductive base having a mounting surface and an open surface opposing the mounting surface, and a board wiring provided on the mounting surface so as to be electrically insulated from the thermal conductive base, and the LED element electrically connected with the board wiring, a heat sink, having a hollow unit inside, provided on the open surface of the thermal conductive base so as to be electrically insulated from the thermal conductive base, and thermally coupled with the thermal conductive base, a translucent cover, provided on the heat sink, and housing the lighting device, and a thermoelectric element, provided in the hollow unit of the heat sink, electrically insulated from the heat sink, and thermally coupled with the heat sink, in which the thermoelectric element includes a casing unit having a housing unit, a first electrode unit provided inside the housing unit, a second electrode unit provided inside the housing unit, separated from and opposing the first electrode unit in a first direction, and having a work function different from that of the first electrode unit, and a middle unit provided between the first electrode unit and the second electrode unit, and including a nanoparticle having a work function between a work function of the first electrode unit and the work function of the second electrode unit, in the housing unit, and in which the casing unit is provided on an inner surface of the hollow unit of the heat sink.

Based on the first invention, the lighting device with an electric power generation function according to a second invention further has a first connection wiring, electrically connected with the first electrode unit, and leading the first electrode unit to outside of the housing unit, and a second connection wiring, electrically connected with the second electrode unit, and leading the second electrode unit to the outside of the housing unit, in which a first electrical contact between the first electrode unit and the first connection wiring and a second electrical contact between the second electrode unit and the second connection wiring are both provided inside the housing unit.

Based on the second invention, the lighting device with an electric power generation function according to a third invention further has the casing unit includes a first board having a first main surface and a second main surface opposing the first main surface and facing the open surface of the thermal conductive base, the casing unit further has a first outer terminal, electrically connected with the first connection wiring, and a second outer terminal, electrically connected with the second connection wiring, and the first outer terminal and the second outer terminal are both provided on the first main surface of the first board.

Based on any one of the first invention to the third invention, in the lighting device with an electric power generation function according to a fourth invention, the thermoelectric element includes at least one of a parallel flat plate-type thermoelectric element and a comb tooth-type thermoelectric element.

Based on any one of the first invention to the fourth invention, the lighting device with an electric power generation function according to a fifth invention further has a power supply circuit, capable of receiving as input each of external input power supplied from outside and auxiliary input power supplied from the thermoelectric element, converting each of the external input power and the auxiliary input power into LED input power, and outputting the LED input power to the LED element.

Based on the fifth invention, in the lighting device with an electric power generation function according to a sixth invention, the power supply circuit includes a capacitor having one electrode and another electrode, the one electrode is electrically coupled with each of a higher potential-side output node of the external input power, an anode of the LED element, and a cathode of the thermoelectric element, and the other electrode is electrically coupled with a lower potential-side wiring of the power supply circuit.

Based on the sixth invention, in the lighting device with an electric power generation function according to a seventh invention, the power supply circuit further includes a first switch, a second switch, and a current-limiting circuit, the higher potential-side output node is electrically coupled with the one electrode via the first switch, the cathode of the thermoelectric element is electrically coupled with the one electrode via the second switch, and the anode of the LED element is electrically coupled with the one electrode via the current-limiting circuit.

Advantageous Effects of Invention

With the lighting device with an electric power generation function according to the first invention, a first electrode unit, a second electrode unit having a work function different from that of the first electrode unit, and a middle unit including nanoparticles having a work function between the work function of the first electrode unit and the work function of the second electrode unit are included inside a housing unit of a casing unit of a thermoelectric element. By this means, the thermoelectric element can generate electric power without creating a temperature difference in the thermoelectric element. Consequently, there is no need for a low-temperature material or a chiller for cooling the low-temperature material. As a result of making the low-temperature material and the chiller for cooling the low-temperature material unnecessary, it is possible to prevent the manufacturing cost of the lighting device with an electric power generation function from increasing. In addition, it is possible to prevent the lighting device with an electric power generation function from becoming bigger in size. The casing unit of the thermoelectric element 1 is provided on the inner surface of the hollow unit of the heat sink. In the lighting device, the hollow unit is a dead space. The thermoelectric element is incorporated in the lighting device by using this dead space. By this means, it is not necessary to secure a new area for mounting the thermoelectric element in the lighting device, so that it is possible to prevent the lighting device from becoming bigger in size.

With the lighting device with an electric power generation function according to the second invention, first and second electrical contacts are both provided inside the housing unit. By this means, when incorporating the thermoelectric element in the lighting device, it is possible to prevent the first and second electrical contacts from breaking or getting damaged, for example, while handling the thermoelectric element, or while working on the installation of the thermoelectric element. By this means, it is possible to prevent the loss of the thermoelectric element, which might occur during the manufacture of the lighting device.

With the lighting device with an electric power generation function according to the third invention, the casing unit includes a first board, which has a first main surface and a second main surface opposing the first main surface and facing the open surface of the thermal conductive base. Then, the first and second outer casing terminals are both provided on the first main surface of the first board. The first main surface can, for example, provide a large area for each of the first and second outer casing terminals, compared to the side surfaces of the casing unit. Furthermore, compared to the side surfaces of the casing unit, the first main surface is easy for the operator to see/identify, and makes it easy for the work robot to extract the work point. Based on these, for example, it is possible to facilitate the work for establishing electrical connections between the thermoelectric element and the lighting device, and, for example, improve the throughput of the lighting device. In addition, the reliability of the assembling of the lighting device having the thermoelectric element improves.

With the lighting device with an electric power generation function according to the fourth invention, the thermoelectric element includes one of a parallel flat plate-type thermoelectric element and a comb tooth-type thermoelectric element. By this means, one example of the thermoelectric element's structure is realized.

With the lighting device with an electric power generation function according to the fifth invention, a power supply circuit is further provided. The power supply circuit converts each of external input power supplied from the outside and auxiliary input power supplied from the thermoelectric element into LED input power, and outputs each LED input power to the LED element. By this means, the power consumption of the lighting device with an electric power generation function can be reduced.

With the lighting device with an electric power generation function according to the sixth invention, the power supply circuit includes a capacitor having one electrode and the other electrode. The one electrode is electrically coupled with the high potential node, the anode of the LED element, and the cathode of the thermoelectric element. Also, the other electrode is electrically coupled with the low potential node, the cathode of the LED element, and the anode of the thermoelectric element. By this means, an example of a power supply circuit is realized.

With the lighting device with an electric power generation function according to the seventh invention, the power supply circuit further includes a first switch, a second switch, and a current-limiting circuit. The high potential node is electrically coupled with the one electrode via the first switch. The cathode of the thermoelectric element is electrically coupled with the one electrode via the second switch. The anode of the LED element is electrically coupled with the one electrode via the current-limiting circuit. By this means, a more specific circuit example of the power supply circuit is realized.

DESCRIPTION OF EMBODIMENTS

Figure 1A:
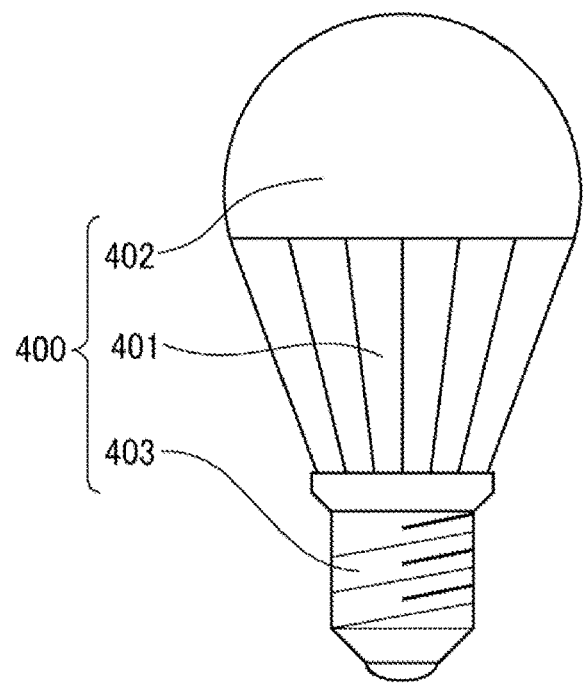
FIG. 1A is a schematic view to show an example of a lighting device with an electric power generation function according to a first embodiment.

Hereinafter, a number of embodiments of the present invention will be described with reference to the drawings. Note that, in each drawing, the direction of height is the first direction Z, one plane direction that intersects (for example, that is orthogonal to) the first direction Z is a second direction X, and another plane direction that intersects (for example, that is orthogonal) both the first direction Z and the second direction X is a third direction Y. Furthermore, in each drawing, common parts will be assigned common reference numerals, and duplicate description will be omitted.

First Embodiment

<Lighting Device with Electric Power Generation Function>

Figure 1B:
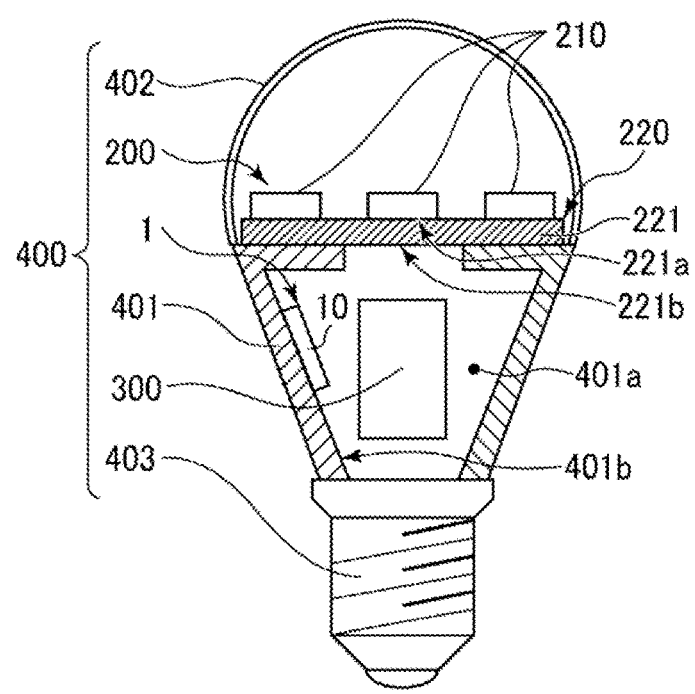
FIG. 1B is a schematic view to show a part of FIG. 1A in a cross section.
Figure 2:
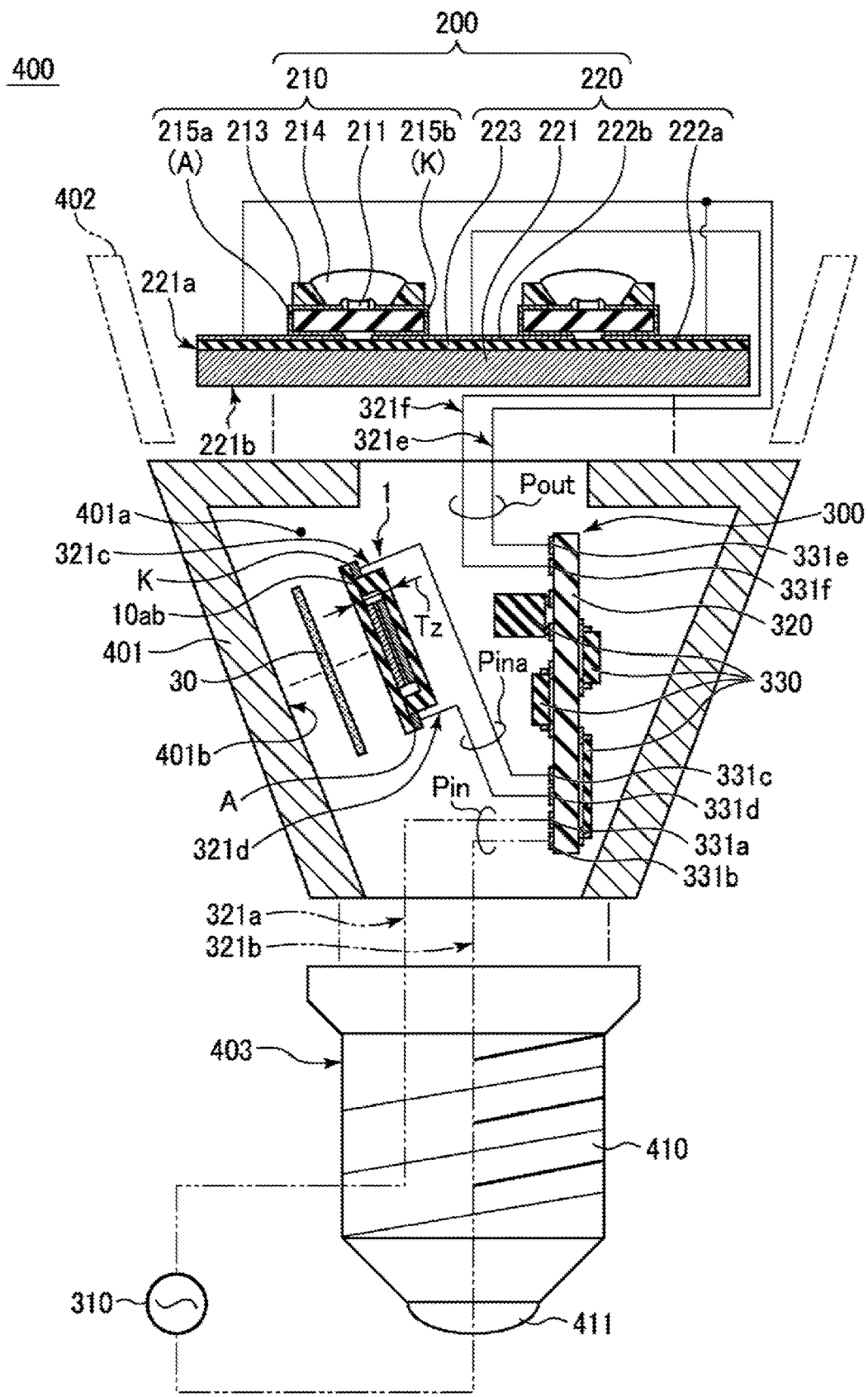
FIG. 2 is a schematic exploded cross-sectional view to show an example of the lighting device with an electric power generation function according to the first embodiment in an exploded state.

FIG. 1A is a schematic view showing an example of a lighting device with an electric power generation function according to the first embodiment. FIG. 1B is a schematic view to show a part of FIG. 1A in a cross section. FIG. 2 is a schematic exploded cross-sectional view to show an example of the lighting device with an electric power generation function according to the first embodiment in an exploded state.

As shown in FIGS. 1A and 1B, and FIG. 2, the lighting device with an electric power generation function (hereinafter abbreviated as "lighting device") 400 according to the first embodiment has an LED (Light-Emitting Diode) element 210 and a thermoelectric element 1. The LED elements 210 convert electrical energy into light energy. The thermoelectric element 1 converts the thermal energy released from the LED elements 210 into electrical energy. The lighting device 400 includes a light-emitting device 200, a heat sink 401, a translucent cover 402, and a thermoelectric element 1. The lighting device 400 further includes a power supply circuit 300.

<Light-Emitting Device>

A light-emitting device 200 includes an LED element 210 and a thermal conductive LED board 220. The thermal conductive LED board 220 includes a thermal conductive base 221, a first board wiring 222a, and a second board wiring 222b. The thermal conductive base 221 has a mounting surface 221a and an open surface 222b opposing the mounting surface 221a. The first and second board wirings 222a and 222b are provided on the mounting surface 221a so as to be electrically insulated from the thermal conductive base 221. The LED elements 210 are electrically connected with the first and second board wirings 222a and 222b.

<Heat Sink>

The heat sink 401 is provided on the open surface 221b of the thermal conductive base 221. The heat sink 401 is electrically insulated from the thermal conductive base 221, and thermally coupled with the thermal conductive base 221. The heat sink 401 is, for example, tubular and has a hollow unit 401a inside. A material having high thermal conductivity is used for the heat sink 401. Examples of the material include aluminum, copper, or an alloy of aluminum and copper.

<Translucent Cover>

The translucent cover 402 is provided on the heat sink 401. The translucent cover 402 houses the light-emitting device 200.

<Thermoelectric Element>

The thermoelectric element 1 is provided on the inner surface 401b of the hollow unit 401a of the heat sink 401. By this means, the thermoelectric element 1 is housed inside the hollow unit 401a of the heat sink 401. The thermoelectric element 1 is adhered to the inner surface 401b by, for example, an adhesive member 30. The thermoelectric element 1 is electrically insulated from the heat sink 401, and thermally coupled with the heat sink 401. The thermoelectric element 1 outputs the auxiliary input power Pina. The thermoelectric element 1 is used as an auxiliary power supply for the lighting device 400, for example.

<Power Supply Circuit>

The power supply circuit 300 is housed in, for example, the hollow unit 401a of the heat sink 401. The power supply circuit 300 is configured to be able to receive as inputs both external input power Pin and auxiliary input power Pina. The external input power Pin is power that is supplied from the outside of the light-emitting device 200. The external input power Pin is supplied from an external power supply, which is, for example, a commercial power supply 310. As for the external power supply, the commercial power supply 310 may be a battery. The auxiliary input power Pina is supplied from the thermoelectric element 1. The power supply circuit 300 converts each of the external input power Pin and the auxiliary input power Pina into LED input power Pout, and outputs each LED input power Pout to the LED element 210.

«Lighting Device: First Example»

The light-emitting device 200 is used as a light source for the lighting device 400. The first example of the lighting device 400 is a light bulb-type LED lamp. The light bulb-type LED lamp according to the first example includes, for example, a power supply circuit 300 and a base unit 403. The base unit 403 is provided in a portion of the heat sink 401 on the side opposite to the side the light-emitting device 200 is mounted. The base unit 403 is detachably and electrically connectable with a socket (not shown). The base unit 403 is electrically insulated from the heat sink 401.

The power supply circuit 300 includes a circuit board 320, electronic components 330, and a first outer terminal 331a to a sixth outer terminal 331f. The electronic components 330 are provided on the circuit board 320. The electronic components 330 are circuit elements that constitute the power supply circuit 300. Examples of circuit elements include resistors, capacitors, coils, diodes, transistors, transformers, regulators and so forth. Note that, as shown in FIG. 2, the electronic components 330 may be provided on the circuit board 320 by using, for example, both the front surface and the back surface of the circuit board 320. The first to sixth outer terminals 331a to 331f are all provided on the circuit board 320. The first outer terminal 331a is electrically connected with a shell 410 of the base unit 403 via a first lead wire 321a. The second outer terminal 331b is electrically connected with an eyelet 411 of the base unit 403 via a second lead wire 321b. The third outer terminal 331c is electrically connected with the cathode K of the thermoelectric element 1 via a third lead wire 321c. The fourth outer terminal 331d is electrically connected with the anode A of the thermoelectric element 1 via a fourth lead wire 321d. The fifth outer terminal 331e is electrically connected with the anode A of the LED element 210 via a fifth lead wire 321e. The sixth outer terminal 331f is electrically connected with the cathode K of the LED element 210 via a sixth lead wire 321f. The first to sixth lead wires 321a to 321f are all provided in the hollow unit 401a.

«Light-Emitting Device: Thermal Conductive LED Board»

The thermal conductive LED board 220 includes a thermal conductive base 221, a first board wiring 222a, and a second board wiring 222b. A material having high thermal conductivity is used for the thermal conductive base 221. Examples of the material include aluminum, copper, an alloy of aluminum and copper, and so forth. The thickness of the thermal conductive base 221 along the first direction Z is, for example, 1 mm or more, up to and 10 mm. The thermal conductive base 221 has a mounting surface 221a and an open surface 221b. The open surface 221b opposes the mounting surface 221a. The first and second board wirings 222a and 222b are both provided on the mounting surface 221a of the thermal conductive base 221 so as to be electrically insulated from the thermal conductive base 221. For example, an insulator 223 is provided on the mounting surface 221a of the thermal conductive base 221. The first and second board wirings 222a and 222b are both provided, for example, on the insulator 223. By this means, the first and second board wirings 222a and 222b are both electrically insulated from the thermal conductive base 221. Examples of the material of the insulator 223 include insulating ceramics having good heat resistance, insulating resins having good heat resistance, and so forth. Aluminum oxide is an example of an insulating ceramic. Epoxy resin, PEEK (Poly Ether Ether Ketone), PEI (Poly Ether Imide) and the like are examples of insulating resins. Note that a well-known thermal conductive LED board 220 can be used.

«Light-Emitting Device: LED Element»

An LED element 210 is electrically connected with the first and second board wirings 222a and 222b. One or more LED elements 210 are provided on the thermal conductive base 221. The LED element 210 includes an LED chip 211, a package board 212, reflectors 213, a translucent enclosing resin 214, a first electrode wiring 215a, and a second electrode wiring 215b. The LED element 210 is an LED package.

The LED chip 211 is provided on the package board 212. The reflectors 213 are provided on the package board 212, and surround the LED chip 211. The translucent sealing resin 214 encloses the LED chip 211. When the LED element 210 is a white LED, at least one monochromatic LED chip 211 is enclosed by the translucent enclosing resin 214 with the package board 212 as the bottom and the reflectors 213 as walls. In case of a white LED, a phosphor is dispersed in the translucent enclosing resin 214. Furthermore, when the LED element 210 is a full-color LED, at least three LED chips 211, corresponding to red, green, and blue (RGB), respectively, are enclosed by the translucent enclosing resin 214, with the package board 212 as the bottom and the reflectors 213 as walls. In case of a full-color LED, a phosphor may not be dispersed in the translucent enclosing resin 214. The first electrode wiring 215a is provided on the package board 212. The first electrode wiring 215a leads, for example, the anode (A) of the LED chip 211 to the outside of the reflectors 213 and the translucent enclosing resin 214. The first electrode wiring 215a is electrically connected with the first board wiring 222a. The second electrode wiring 215b is provided on the package board 212. The second electrode wiring 215b leads, for example, the cathode (K) of the LED chip 211 to the outside of the reflectors 213 and the translucent enclosing resin 214. The second electrode wiring 215b is electrically connected with the second board wiring 222b. Note that well-known LED elements 210 can be used.

«Thermoelectric Element: First Example»

Figure 3A:
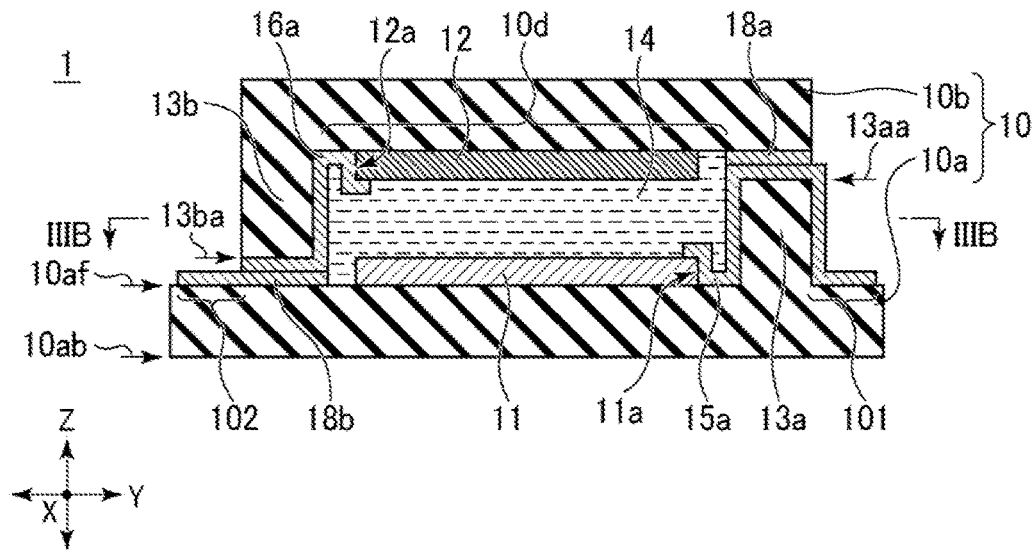
FIGS. 3A and 3B are schematic cross-sectional views to show a first example of a thermoelectric element.
Figure 3B:
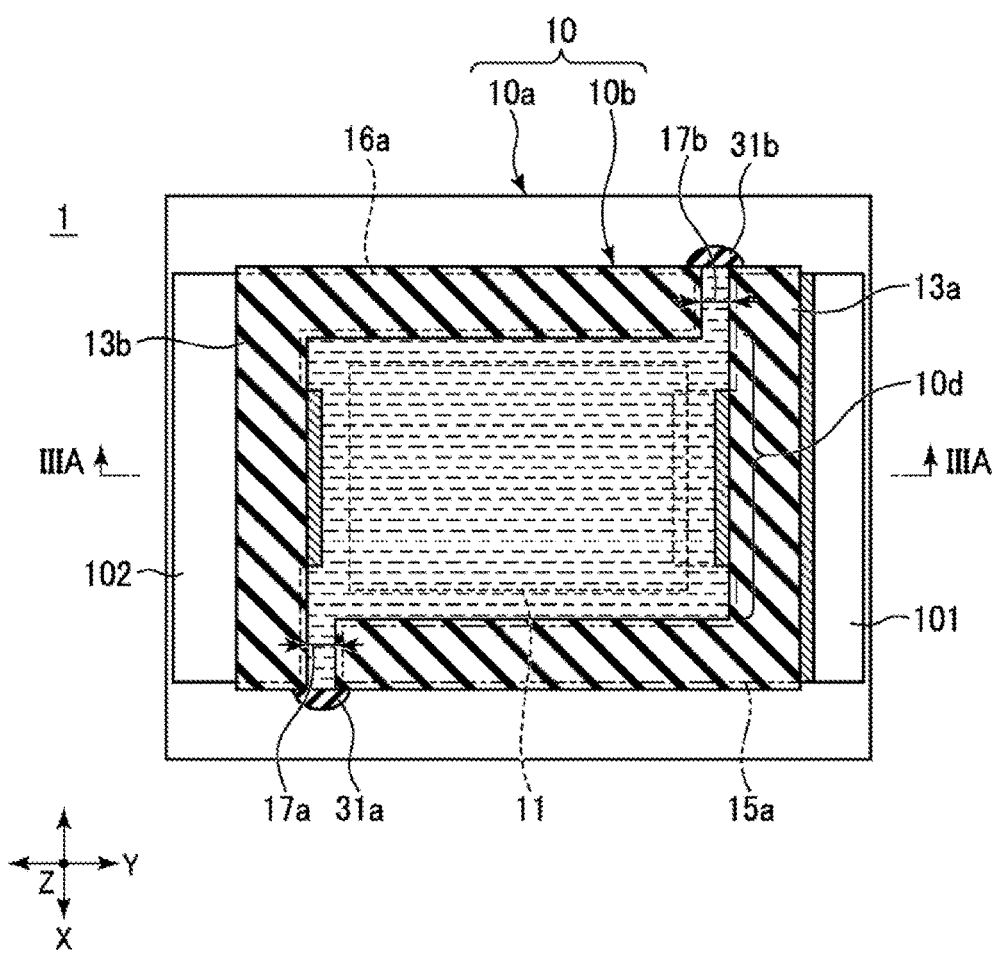
Figure 4:
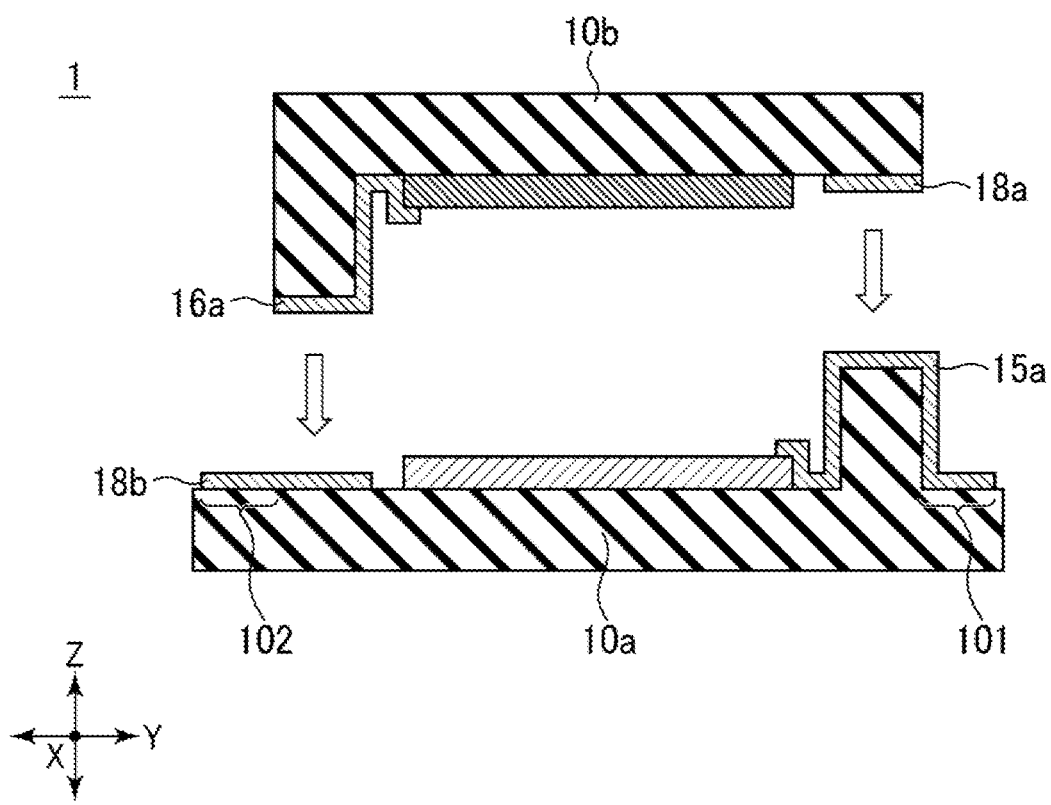
FIG. 4 is a schematic cross-sectional view to show an example of joining.

FIGS. 3A and 3B are schematic cross-sectional views to show an example of a thermoelectric element. The schematic cross section shown in FIG. 3A is taken along the line IIIA-IIIA in FIG. 3B. The schematic cross section shown in FIG. 3B is taken along the line IIIB-IIIB in FIG. 3A. FIG. 4 is a schematic cross-sectional view to show an example of joining. FIG. 4 corresponds to the schematic cross section shown in FIG. 3A.

As shown in FIGS. 3A and 3B, the thermoelectric element 1 includes a casing unit 10, a first electrode unit 11, a second electrode unit 12, and a middle unit 14. The casing unit 10 is provided on the open surface 221b of the thermal conductive base 221. The casing unit 10 is adhered to the open surface 221b by, for example, an adhesive member 30 (FIG. 2). Alternatively, the casing unit 10 is fixed on the open surface 221b by a brazing material such as solder. The thickness Tz of the thermoelectric element 1 along the first direction Z is approximately 20 μm to 6 mm (FIG. 2).

The casing unit 10 includes a first board 10a and a second board 10b, in the thermoelectric element 1. The thickness of each of the first and second boards 10a and 10b along the first direction Z is, for example, 10 μm or more, up to 2 mm. For the material of both the first and second boards 10a and 10b, a flat insulating material may be chosen. Examples of insulating materials include silicon, quartz, glass such as Pyrex (registered trademark), and insulating resins. The first and second boards 10a and 10b may be shaped like thin plates, or may be, for example, shaped like flexible films. For example, when the first and second boards 10a or 10b are shaped like flexible films, for example, PET (PolyEthylene Terephthalate), PC (PolyCarbonate), polyimide, or the like can be used. Furthermore, the first and second boards 10a and 10b do not have to be insulating. The surface of semiconductor boards or metal boards may be coated with, for example, an insulating film. To illustrate an example of such a board coated with an insulating film, for example, a silicon (Si) board having a silicon oxide (for example, $SiO_2$) film formed on its surface may be used.

The first board 10a includes, for example, the first support unit 13a. The first support unit 13a extends from the first board 10a toward the second board 10b, along the first direction Z. The planar shape of the first support unit 13a is shaped like the letter "L", extending in both the second direction X and the third direction Y when viewed from the first direction Z. The second board 10b includes, for example, a second support unit 13b. The second support unit 13b extends from the second board 10b toward the first board 10a, along the first direction Z. The planar shape of the second support unit 13b is shaped like the letter "L", extending in both the second direction X and the third direction Y when viewed from the first direction Z. The thickness of both the first and second support units 13a and 13b along the first direction Z is, for example, 10 nm or more, up to 10 μm. The second support unit 13b and the first support unit 13a are separated from each other via, for example, two slits 17a and 17b.

The first and second support units 13a and 13b may be both provided integrally with the first and second boards 10a and 10b, or may be provided separately. When the first and second support units 13a and 13b are provided integrally, the material of both the first and second support units 13a and 13b is the same material as that of the first and second boards 10a and 10b. When the first and second support units 13a and 13b are provided separately, examples of the material of the first and second support units 13a and 13b may include silicon oxides, polymers, and so forth. Examples of polymers include polyimides, PMMA (PolyMethyl MethAcrylate), polystyrene, and so forth.

The slits 17a and 17b are sealed by sealing members 31a and 31b, respectively. The sealing members 31a and 31b may be integrated. In this case, the sealing member 31a and the sealing member 31b become one sealing member 31, and are provided in an annular shape along the outer surfaces of the first and second support units 13a and 13b, respectively. To give an example of the material of the sealing members 31a and 31b, an insulating resin may be used. A fluorine-based insulating resin may be an example of an insulating resin.

The first electrode unit 11 is provided inside the housing unit 10d. The first electrode unit 11 is provided on the first board 10a in the thermoelectric element 1. The second electrode unit 12 is provided inside the housing unit 10d. The second electrode unit 12 is provided on the second board 10b in the thermoelectric element 1. The first electrode unit 11 and the second electrode unit 12 form a pair of parallel flat plate-type electrodes. The thermoelectric element 1 is a parallel flat plate-type thermoelectric element.

In the thermoelectric element 1, the first electrode unit 11 includes, for example, platinum (work function: approximately 5.65 eV). The second electrode unit 12 includes, for example, tungsten (work function: approximately 4.55 eV). The electrode unit having the larger work function functions as an anode A (collector electrode), and the electrode unit having the smaller work function functions as a cathode K (emitter electrode). In the thermoelectric element 1, the first electrode unit 11 is the anode A, and the second electrode unit 12 is the cathode K. The thermoelectric element 1 like this makes use of the absolute temperature-induced electron emission phenomenon produced between the first electrode unit 11 and the second electrode unit 12 having a work function difference. Consequently, the thermoelectric element 1 can convert thermal energy into electrical energy even when the temperature difference between the first electrode unit 11 and the second electrode unit 12 is insignificant. Furthermore, the thermoelectric element 1 can convert thermal energy into electrical energy even when there is no temperature difference between the first electrode unit 11 and the second electrode unit 12. Note that the first electrode unit 11 may be used as the cathode K, and the second electrode unit 12 may be used as the anode A.

The thickness of both the first and second electrode units 11 and 12 along the first direction Z is, for example, 1 nm or more, up to 1 μm. More preferably, this thickness is 1 nm or more, up to 50 nm. The material of both the first and second electrode units 11 and 12 can be chosen from, for example, the following metals:

Platinum (Pt)
Tungsten (W)
Aluminum (Al)
Titanium (Ti)
Niobium (Nb)
Molybdenum (Mo)
Tantalum (Ta)
Rhenium (Re)

In the thermoelectric element 1, it suffices that a work function difference be produced between the first electrode unit 11 and the second electrode unit 12. Consequently, it is possible to choose metals other than those listed above, for the material of the first electrode units 11 and 12. Furthermore, it is also possible to choose an alloy, an intermetallic compound, and a metal compound, apart from the metals listed above, for the material of the first and second electrode units 11 and 12. A metal compound is a combination of a metal element and a non-metal element. For example, lanthanum hexaboride ($LaB_6$) may be an example of a metal compound.

It is also possible to choose a non-metallic conductor for the material of the first and second electrode units 11 and 12. Examples of non-metallic conductors may include silicon (Si: for example, p-type Si or n-type Si), carbon-based materials such as graphene, and so forth.

If materials other than refractory metals is chosen for the material for the first electrode unit 11 and the second electrode unit 12, the advantages described below can be additionally provided. In the present specification, the refractory metals are, for example, W, Nb, Mo, Ta, and Re. When, for example, Pt is used for the first electrode unit (anode A) 11, it is preferable to use at least one of Al, Si, Ti, and $LaB_6$ for the second electrode unit (cathode K) 12.

For example, the melting points of Al and Ti are lower than those of the above refractory metals. Consequently, from both Al and Ti, better processability than the above refractory metals can be provided as an advantage.

For example, Si is easier to form than the above refractory metals. Consequently, from Si, more improved productivity of the thermoelectric element 1 can be provided as an additional advantage, besides the above-noted good processability.

For example, the melting point of $LaB_6$ is higher than those of Ti and Nb. However, the melting point of $LaB_6$ is lower than those of W, Mo, Ta, and Re. $LaB_6$ is easier to process than W, Mo, Ta, and Re. Moreover, the work function of $LaB_6$ is approximately 2.5 to 2.7 eV. $LaB_6$ is more likely to release electrons than the above refractory metals. Consequently, from $LaB_6$, an additional advantage that the electric power generation efficiency of the thermoelectric element 1 can be further improved, can be provided.

Note that the structures of both the first electrode unit 11 and the second electrode unit 12 may have a single-layer structure comprised of the above materials, and, besides, have a laminated structure comprised of the above materials.

The thermoelectric element 1 further includes a first connection wiring 15a and a second connection wiring 16a. The first connection wiring 15a is electrically connected with the first electrode unit 11 inside the housing unit 10d. By this means, the first electrical contact 11a between the first electrode unit 11 and the first connection wiring 15a is provided inside the housing unit 10d. On the board-joining surface 13aa of the first support unit 13a, the planar shape of the first connection wiring 15a is shaped like the letter "L", extending in both the second direction X and the third direction Y when viewed from the first direction Z. This is substantially the same as the planar shape of the first support unit 13a. The first connection wiring 15a is joined with the first joining metal 18a between the first support unit 13a and the second board 10b. The first joining metal 18a is provided on the second board 10b. The planar shape of the first joining metal 18a is shaped like the letter "L", extending in both the second direction X and the third direction Y when viewed from the first direction Z. This is substantially the same as the planar shape of the first connection wiring 15a on the board-joining surface 13aa.

The second connection wiring 16a is electrically connected with the second electrode unit 12 inside the housing unit 10d. By this means, the second electrical contact 12a between the second electrode unit 12 and the second connection wiring 16a is provided inside the housing unit 10d. On the board-joining surface 13ba of the second support unit 13b, the planar shape of the second connection wiring 16a is shaped like the letter "L", extending in both the second direction X and the third direction Y when viewed from the first direction Z. This is substantially the same as the planar shape of the second support unit 13b. The second connection wiring 16a is joined with the second joining metal 18b between the second support unit 13b and the first board 10a. The second joining metal 18a is provided on the first board 10a. The planar shape of the second joining metal 18b is shaped like the letter "L", extending in both the second direction X and the third direction Y when viewed from the first direction Z. This is substantially the same as the planar shape of the second connection wiring 16a on the board-joining surface 13ba.

The first and second joining metals 18a and 18b include, for example, metals that can be joined with the first and second connection wirings 15a and 16a. By this means, for example, as shown in FIG. 4, the second board 10b can be joined with the first board 10a by the joining of the first connection wiring 15a and the first joining metal 18a and the joining of the second connection wiring 16a and the second joining metal 18b. Then, the housing unit 10d is formed in the casing unit 10. When Au is used for the first and second connection wirings 15a and 16a and for the first and second joining metals 18a and 18b, the first and second connection wirings 15a and 16a can be joined with the first and second joining metals 18a and 18b, respectively, by way of thermocompression bonding. For the first and second connection wirings 15a and 16a, and for the first and second joining metals 18a and 18b, for example, metals that are capable of thermocompression, eutectic bonding and so forth, or alloys, can be used, besides gold.

Note that the work functions of the metals or alloys used for the first and second connection wirings 15a and 16a and the first and second joining metals 18a and 18b are preferably between the work function of the first electrode unit 11 and the work function of the second electrode unit 12, from the perspective of preventing the decline of electric power generation efficiency, for example. Furthermore, when an intermetallic compound is produced at the joint portion where metals are joined with each other by means of eutectic bonding and the like, the work function of the intermetallic compound that is produced is also preferably between the work function of the first electrode unit 11 and the work function of the second electrode unit 12.

The first connection wiring 15a is further provided on each of the inner surface of the first support unit 13a, the board-joining surface 13a, and the outer surface of the first support unit 13a. The first connection wiring 15a leads the first electrode unit 11 out of the housing unit 10d. The second connection wiring 16a is further provided on both the inner side surface of the second support unit 13b and on the board-joining surface 13aa. The second connection wiring 16a leads the second electrode unit 12 out of the housing unit 10d.

The first board 10a has a first main surface 10af and a second main surface 10ab. The second main surface 10ab opposes the first main surface 10af, and faces the open surface 221b of the thermal conductive base 221. The second main surface 10ab is adhered to the open surface 221b by, for example, the adhesive member 30. Alternatively, the second main surface 10ab is fixed on the open surface 221b by means of, for example, a brazing material. The first outer casing terminal 101 and the second outer casing terminal 102 are both provided on the first main surface 10af of the first board 10a. The first outer casing terminal 101 is electrically connected with the first connection wiring 15a. The second outer casing terminal 102 is electrically connected with the second connection wiring 16a. The first main surface 10af has, for example, portions that project outward from the first and second support units 13a and 13b, respectively. The first outer casing terminal 101 is provided, for example, in the portion of the first main surface 10af that projects outward from the first support unit 13a. The second outer casing terminal 102 is provided, for example, in the portion of the first main surface of that projects outward from the second support unit 13b. In the thermoelectric element 1, the first outer casing terminal 101 uses the pattern of the first connection wiring 15a and is formed of the same conductor as that of the first connection wiring 15a. Furthermore, the second outer casing terminal 102 uses the pattern of the second joining metal 18b, and is formed of the same conductor as that of the second joining metal 18b.

Figure 5A:
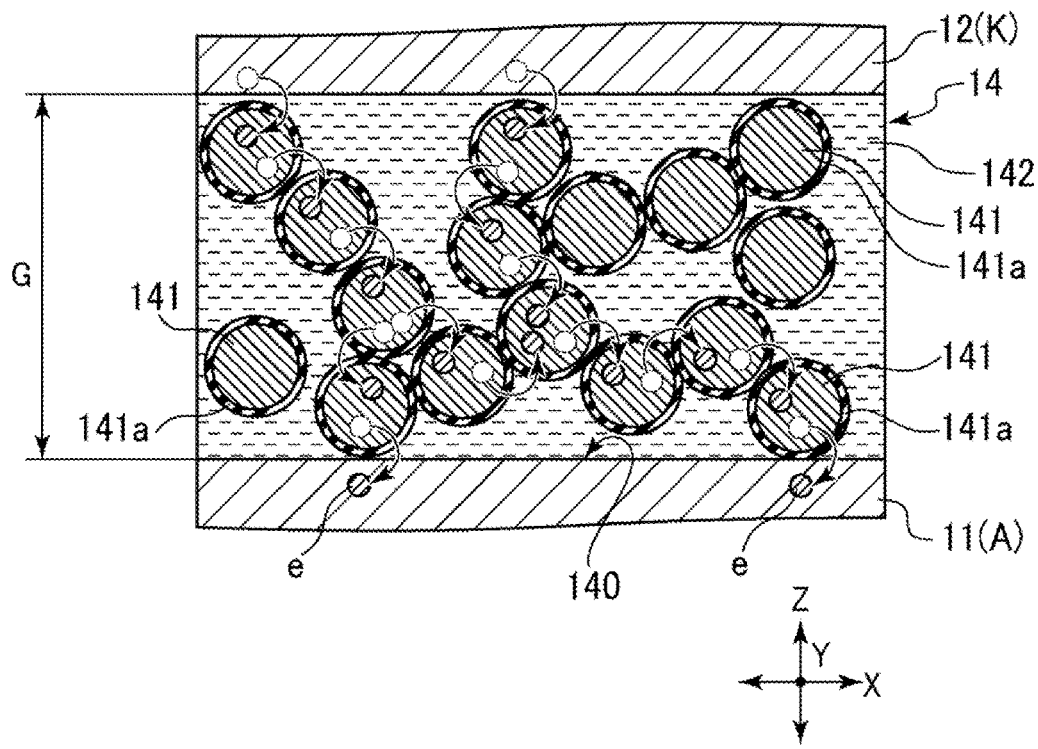
FIG. 5A is a schematic cross-sectional view to show an example of a middle unit.
Figure 5B:
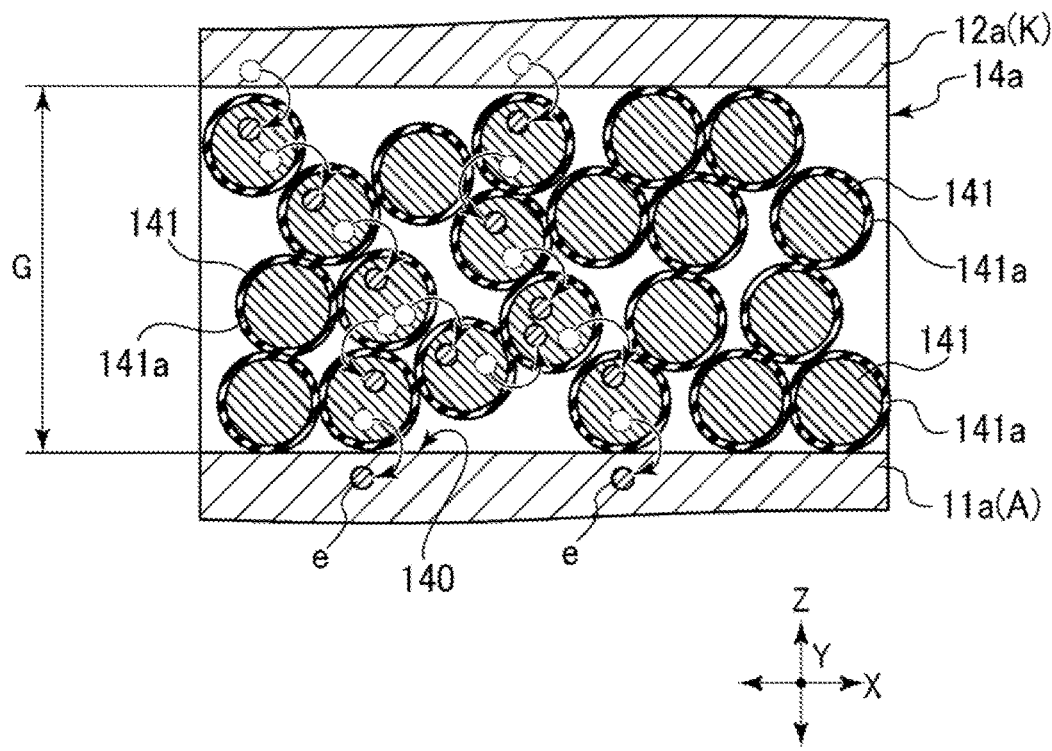
FIG. 5B is a schematic cross-sectional view to show another example of the middle unit.

FIG. 5A is a schematic cross-sectional view to show an example of the middle unit. FIG. 5B is a schematic cross-sectional view to show another example of the middle unit.

As shown in FIG. 5A, the middle unit 14 is provided between the first electrode unit 11 and the second electrode unit 12, inside the housing unit 10d. The middle unit 14 includes nanoparticles having a work function between the work function of the first electrode unit 11 and the work function of the second electrode unit 12. The middle unit 14 is, for example, a portion where the electrons released from the second electrode unit (cathode K) 12 travel toward the first electrode unit (anode A) 11.

An inter-electrode gap G is set between the first electrode unit 11 and the second electrode unit 12, along the first direction Z. In the thermoelectric element 1, the inter-electrode gap G is set based on the thickness of each of the first and second support units 13a and 13b along the first direction Z. An example of the width of the inter-electrode gap G is, for example, a finite value of 10 μm or less. The narrower the width of the inter-electrode gap G, the more efficiently the electrons e can be released from the second electrode unit (cathode K) 12, and the more efficiently the electrons e can travel from the second electrode unit 12 to the first electrode unit (anode A) 11. Consequently, the electric power generation efficiency of the thermoelectric element 1 is improved. Furthermore, the narrower the width of the inter-electrode gap G, the thinner the thickness of the thermoelectric element 1 along the first direction Z can be. Consequently, for example, the width of the inter-electrode gap G should be narrow. More preferably, the width of the inter-electrode gap G is, for example, 10 nm or more, up to 100 nm. Note that the width of the inter-electrode gap G and the thickness of the first support unit 13a to the third support unit 13c along the first direction Z are substantially equivalent.

The middle unit 14 includes, for example, a plurality of nanoparticles 141 and a solvent 142. The nanoparticles 141 are dispersed in the solvent 142. The middle unit 14 is formed, for example, by filling the gap unit 140 with the solvent 142, in which the nanoparticles 141 are dispersed. The particle size of the nanoparticles 141 is smaller than the inter-electrode gap G. The particle size of the nanoparticles 141 is, for example, a finite value of $\frac{1}{10}$ of the inter-electrode gap G or less. When the particle size of the nanoparticles 141 is set to $\frac{1}{10}$ or less of the inter-electrode gap G, it becomes easy to form the middle unit 14 including the nanoparticles 141, in the gap unit 140. By this means, workability is improved in the production of the thermoelectric element 1.

The nanoparticles 141 include a conductor, for example. The value of the work function of the nanoparticles 141 is, for example, between the value of the work function of the first electrode unit 11 and the value of the work function of the second electrode unit 12. For example, the value of the work function of the nanoparticles 141 is in the range of 3.0 eV to 5.5 eV. By this means, the electrons e released in the middle unit 14 can travel from the second electrode unit 12 to the first electrode unit 11 via the nanoparticles 141, for example. This makes it possible to further increase the amount of electrical energy to be generated, compared to the case where the nanoparticles 141 are not present in the middle unit 14.

At least one of gold and silver can be chosen as an example of the material of the nanoparticles 141. Note that it suffices that the value of the work function of the nanoparticles 141 be between the value of the work function of the first electrode unit 11 and the value of the work function of the second electrode unit 12. Consequently, it is also possible to choose a conductive material other than gold and silver for the material of the nanoparticles 141.

The particle size of the nanoparticles 141 is, for example, a finite value of $\frac{1}{10}$ or less of the inter-electrode gap G. To be more specific, the particle size of the nanoparticles 141 is 2 nm or more, up to 10 nm. Furthermore, the nanoparticles 141 may have, for example, an average particle size (for example, D50) of 3 nm or more, up to 8 nm. The average particle size can be measured using, for example, a particle size distribution measuring instrument. To give an example of a particle size distribution measuring instrument, for example, a particle size distribution measuring instrument to use the laser diffraction/scattering method (for example, Nanotrac Wave II-EX150 manufactured by Microtrac BEL) may be used.

The nanoparticles 141 have, for example, an insulating film 141a on their surface. At least one of an insulating metal compound and an insulating organic compound can be chosen as an example of the material of the insulating film 141a. Silicon oxides and alumina are examples of insulating metal compounds. Alkanethiol (for example, dodecanethiol) and the like are examples of insulating organic compounds. The thickness of the insulating film 141a is, for example, a finite value of 20 nm or less. When an insulating film 141a like this is provided on the surface of the nanoparticles 141, the electrons e can, for example, travel between the second electrode unit (cathode K) 12 and the nanoparticles 141, and between the nanoparticles 141 and the first electrode unit (anode A) 11 by making use of the tunnel effect. Consequently, for example, the electric power generation efficiency of the thermoelectric element 1 is expected to improve.

As for the solvent 142, for example, a liquid having a boiling point of 60° C. or higher can be used. Consequently, it is possible to reduce the vaporization of the solvent 142 even when the thermoelectric element 1 is used, in an environment of room temperature (for example, 15° C. to 35° C.) or higher. By this means, the deterioration of the thermoelectric element 1 due to the vaporization of the solvent 142 can be reduced. At least one of an organic solvent and water can be chosen as an example of the liquid. Examples of the organic solvent include methanol, ethanol, toluene, xylene, tetradecane, alkanethiol, and so forth. Note that the solvent 142 is preferably a liquid that has a high electrical resistance value and is insulating.

Furthermore, as shown in FIG. 5B, the middle unit 14 may include only the nanoparticles 141, and not include the solvent 142. If the middle unit 14 includes only the nanoparticles 141, it is not necessary to take into account the vaporization of the solvent 142 even when, for example, the thermoelectric element 1 is used in a high temperature environment. This makes it possible to reduce the deterioration of the thermoelectric element 1 in a high temperature environment.

<Operation of Thermoelectric Element>

When the thermoelectric element 1 is given thermal energy, for example, electrons e are released from the second electrode unit (cathode K) 12 toward the middle unit 14. The released electrons e travel from the middle unit 14 to the first electrode unit (anode A) 11. The current flows from the first electrode unit 11 to the second electrode unit 12. In this way, thermal energy is converted into electrical energy.

With this lighting device 400, the thermoelectric element 1 includes, in the housing unit 10d of the casing unit 10, the first electrode unit 11, the second electrode unit 12, having a work function different from that of the first electrode unit 11, and a middle unit 14, including nanoparticles 141 that have a work function between the work function of the first electrode unit 11 and the work function of the second electrode unit 12. By this means, the thermoelectric element 1 can generate electric power without producing temperature differences inside the thermoelectric element 1. Consequently, there is no need for a low-temperature material or a chiller for cooling the low-temperature material. As a result of making the low-temperature material and the chiller for cooling the low-temperature material unnecessary, it is possible to prevent the manufacturing cost of the lighting device 400 from increasing, and prevent the size of the lighting device 400 200 from becoming bigger.

Furthermore, according to the lighting device 400, the following additional advantages can be provided:

(1) The casing unit 10 of the thermoelectric element 1 is provided on the inner surface 401b of the hollow unit 401a of the heat sink 401. In the lighting device 400, the hollow unit 401a is a dead space. Consequently, the thermoelectric element 1 is incorporated in the lighting device 400 by using this dead space. By this means, it is not necessary to secure a new area for mounting the thermoelectric element 1 in the lighting device 400, so that it is possible to prevent the lighting device 400 from becoming bigger in size.

(2) The first and second electrical contacts 11a and 12a are both provided inside the housing unit 10d. By this means, when incorporating the thermoelectric element 1 the lighting device 400, for example, while handling the thermoelectric element 1, or while working on the installation of the thermoelectric element 1, it is possible to prevent the first and second electrical contacts 11a and 12a from breaking or getting damaged. By this means, it is possible to prevent the loss of the thermoelectric element 1, which might occur during the manufacture of the lighting device 400.

(3) The casing unit 10 includes a first board 10a, which has a first main surface 10af, and a second main surface 10ab, opposing the first main surface 10af and facing the open surface 221b of the thermal conductive base 221. Then, the first and second outer casing terminals 101 and 102 are both provided on the first main surface 10af of the first board 10a. The first main surface 10af can, for example, provide a large area for each of the first and second outer casing terminals 101 and 102, compared to the side surfaces of the casing unit 10. Furthermore, compared to the side surfaces of the casing unit 10, the first main surface is easy for the operator to see/identify, and makes it easy for the work robot to extract the work point. Based on these, for example, it is possible to facilitate the work for establishing electrical connections between the thermoelectric element 1 and the lighting device 400, and, for example, improve the throughput of the lighting device 400. In addition, the reliability of the assembling of the lighting device 400 having the thermoelectric element 1 also improves. Furthermore, when the lighting device 400 further includes the power supply circuit 300, it is possible to facilitate the work for establishing electrical connections between the thermoelectric element 1 and the power supply circuit 300.

(4) In the power supply circuit 300, both the external input power Pin supplied from the outside and the auxiliary input power Pina supplied from the thermoelectric element 1 are converted into LED input power, and output to the LED elements 210. By this means, the power consumption of the lighting device 400 can be reduced.

(5) With the lighting device 400, it is also possible to use the auxiliary input power Pina generated by the thermoelectric element 1 as an emergency power supply. This lighting device 400 can be lit without a power supply in the event of a power failure. That is, the lighting device 400 can be lit without a power supply, for and over the period of time specified by the Fire Service Act of Japan, for example. By this means, the lighting device 400 can also be used as, for example, a light source for emergency lighting and guide lights in evacuation passages. Moreover, in the event of a power failure, the lighting device 400 can be lit for a long period of time, compared to a regular-emergency dual-purpose lighting device that has a built-in battery or storage battery and that can be lit only for a dischargeable period of time.

First Embodiment: First Modification

Next, a first modification of the first embodiment will be described below. The first modification relates to a modification of the thermoelectric element.

Figure 6A:
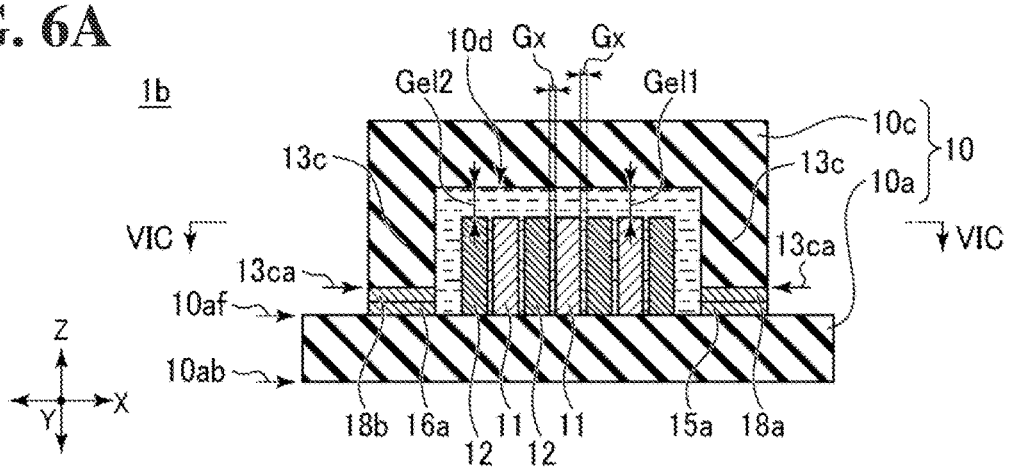
FIGS. 6A to 6C are schematic cross-sectional views to show an example of a thermoelectric element according to a first modification.
Figure 6B:
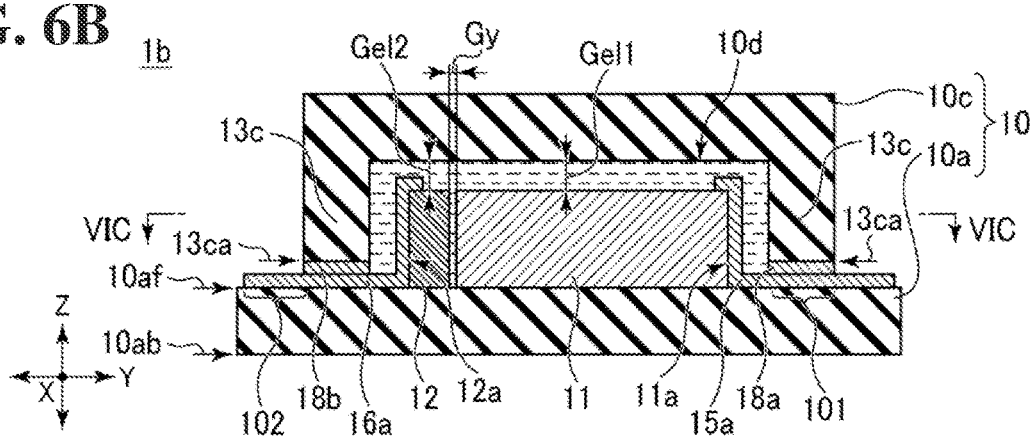
Figure 6C:
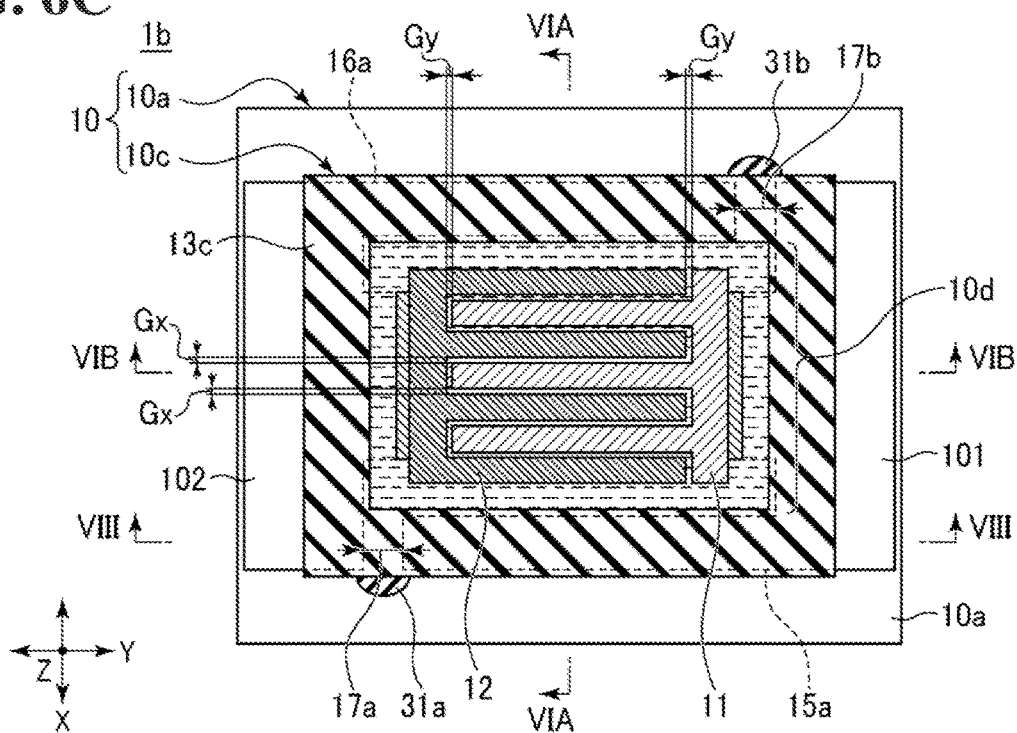
Figure 7:
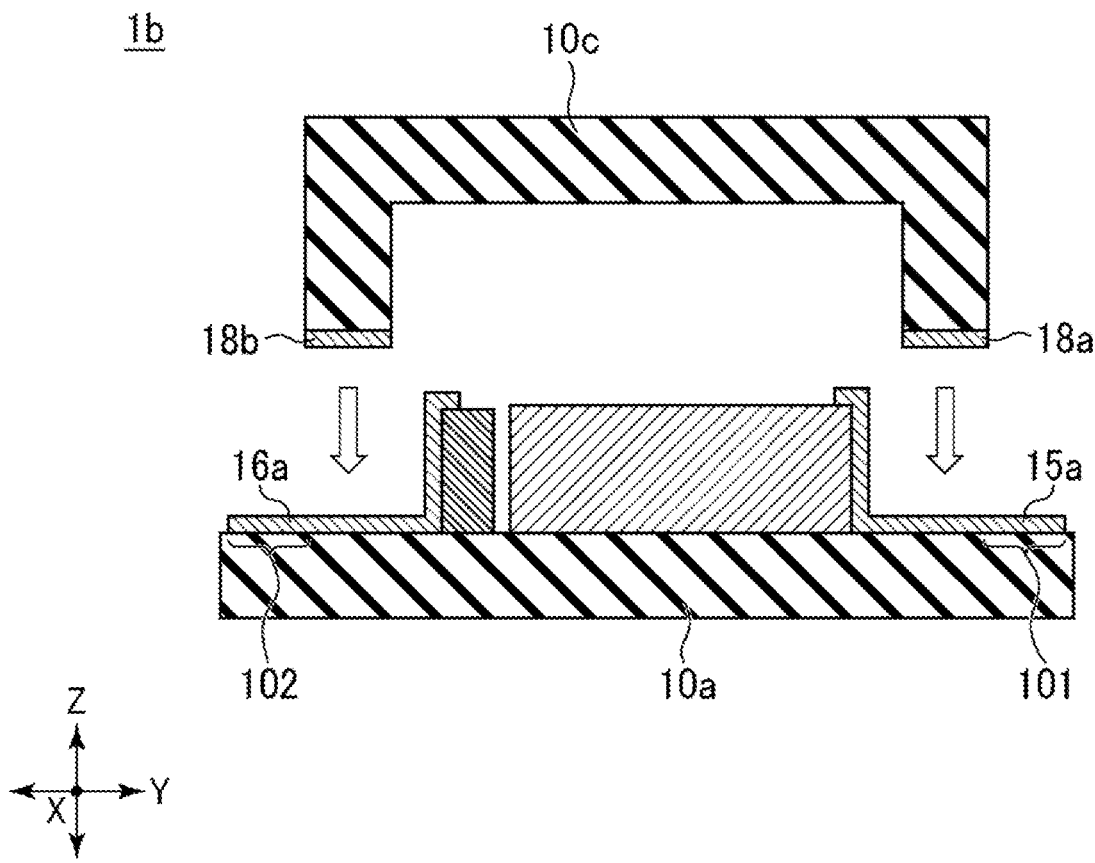
FIG. 7 is a schematic cross-sectional view to show an example of joining.

FIGS. 6A to 6C are schematic cross-sectional views to show an example of a thermoelectric element according to the first modification. The schematic cross section shown in FIG. 6A is taken along the line VIA-VIA in FIG. 6C. The schematic cross section shown in FIG. 6B is taken along the line VIB-VIB in FIG. 6C. The schematic cross section shown in FIG. 6C is taken along the line VIC-VIC in FIGS. 6A and 6B. FIG. 7 is a schematic cross-sectional view to show an example of joining. FIG. 7 corresponds to the schematic cross section shown in FIG. 6B.

As shown in FIGS. 6A to 6C, the thermoelectric element 1b according to the first modification is different from the thermoelectric element 1 in that the planar shape of the first electrode unit 11 seen from the first direction Z and the planar shape of the second electrode unit 12 seen from the first direction Z are both comb-toothed.

The comb teeth of the first and second electrode units 11 and 12 both extend along the third direction Y. The angle of comb teeth is opposite between the first electrode unit 11 and the second electrode unit 12. The comb-tooth unit of the first electrode unit 11 and the comb-tooth unit of the second electrode unit 12 mesh with each other while kept separated from each other. By this means, an inter-electrode gap G is defined between the comb-tooth unit of the first electrode unit 11 and the comb-tooth unit of the second electrode unit 12. In the thermoelectric element 1b, the direction in which the inter-electrode gap G is defined is two directions, namely the second direction X (inter-electrode gap Gx) and the third direction Y (inter-electrode gap Gy) (FIG. 10C).

As for the thermoelectric element, a thermoelectric element 1b having comb tooth-type electrodes can also be used, in addition to the thermoelectric element 1 having parallel flat plate-type electrodes.

The first and second electrode units 11 and 12 are comb tooth-type in the thermoelectric element 1b, so that the inter-electrode gap G varies less, due to the heat of the LED element 210, than the parallel flat plate-type thermoelectric element 1. By this means, for example, the thermoelectric element 1b can provide an additional advantage of making it easy to reduce the small fluctuations in electric power generation efficiency, compared to the thermoelectric element 1.

Furthermore, the thermoelectric element 1b has been further devised as follows:

The casing unit 10 includes a first board 10a and a lid body 10c; and

The first electrode unit 11, the second electrode unit 12, the first connection wiring 15a and the second connection wiring 16a are all provided on the first main surface 10af.

Hereinafter, the thermoelectric element 1b will be described in more detail.

The lid body 10c includes the third support unit 13c. The third support unit 13c extends from the lid body 10c toward the first board 10a, along the first direction Z. The planar shape of the third support unit 13a is shaped like a frame when viewed from the first direction Z. The lid body 10c may be provided integrally with the third support unit 13c, or may be provided separately.

The first and second electrode units 11 and 12 are both provided inside the housing unit 10d. Planes that expand in the second direction X and the third direction Y are surrounded by the lid body 10c, and surrounded by the third support unit 13c, along both the second direction X and the third direction Y, thereby forming the housing unit 10d in the casing unit 10.

The first connection wiring 15a is electrically connected with the first electrode unit 11 inside the housing unit 10d. By this means, the first electrical contact 11a between the first electrode unit 11 and the first connection wiring 15a is provided inside the housing unit 10d. The second connection wiring 16a is electrically connected with the second electrode unit 12 inside the housing unit 10d. By this means, the second electrical contact 12a between the second electrode unit 12 and the second connection wiring 16a is provided inside the housing unit 10d.

On the board-joining surface 13ca of the third support unit 13c, the planar shape of the first connection wiring 15a is shaped like the letter "L", extending in both the second direction X and the third direction Y when viewed from the first direction Z. The first connection wiring 15a is joined with the first joining metal 18a between the third support unit 13c and the first board 10a. The first joining metal 18a is provided on the board-joining surface 13ca of the lid body 10c. The planar shape of the first joining metal 18a is shaped like the letter "L", extending in both the second direction X and the third direction Y when viewed from the first direction Z. This is substantially the same as the planar shape of the first connection wiring 15a on the board-joining surface 13ca.

On the board-joining surface 13ca of the third support unit 13c, the planar shape of the second connection wiring 16a is shaped like the letter "L", extending in both the second direction X and the third direction Y when viewed from the first direction Z. The second connection wiring 16a is joined with the second joining metal 18b between the third support unit 13c and the first board 10a. The second joining metal 18b is provided on the board-joining surface 13ca of the lid body 10c. The planar shape of the second joining metal 18b is shaped like the letter "L", extending in both the second direction X and the third direction Y when viewed from the first direction Z. This is substantially the same as the planar shape of the second connection wiring 16a on the board-joining surface 13ca.

By this means, for example, as shown in FIG. 7, the lid body 10c can be joined with the first board 10a by means of the joining of the first connection wiring 15a and the first joining metal 18a and the joining of the second connection wiring 16a and the second joining metal 18b. Then, the housing unit 10d is formed in the casing unit 10.

The first connection wiring 15a and the second connection wiring 16a are separated from each other on the first main surface 10af, via slits 17a and 17b, so as not to contact each other. The first and second joining metals 18a and 18b may be electrically connected with the first and second connection wirings 15a and 16a, respectively. In this case, as shown in FIG. 6C, it suffices that the first joining metal 18a and the second joining metal 18b be separated from each other, via the slits 17a and 17b, so as not to contact each other. By this means, it is possible to prevent the short circuiting of the first connection wiring 15a and the second connection wiring 16a via the first and second joining metals 18a and 18b.

Figure 8:
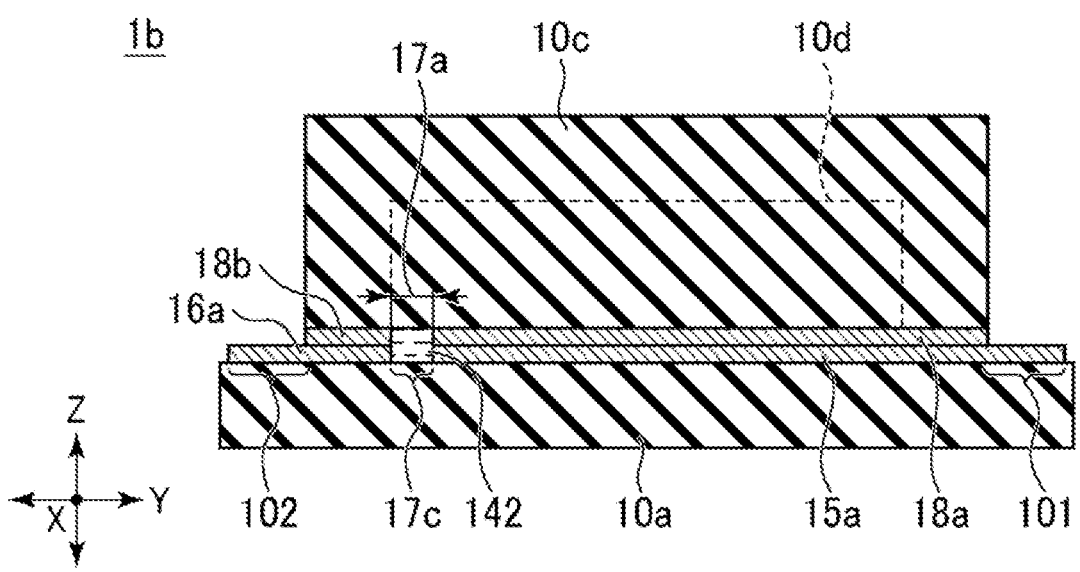
FIG. 8 is a schematic cross-sectional view to show an example of a slit.

FIG. 8 is a schematic cross-sectional view to show an example of a slit. The schematic cross section shown in FIG. 8 is taken along the line VIII-VIII in FIG. 6C. As shown in FIG. 8, the slits 17a and 17b create a small gap 17c in the thermoelectric element 1b. It then follows that the solvent 142 injected in the gap unit 140 may leak from this small gap. Consequently, as shown in FIG. 10C, sealing members 31a and 31b may be provided between the first board 10a and the lid body 10c, and the slits 17a and 17b may be closed with the sealing members 31a and 31b, respectively. By this means, it is possible to prevent the solvent 142 from leaking through the slits 17a and 17b.

In the thermoelectric element 1b, furthermore, a gap Ge11 is provided between the first electrode unit 11 and the lid body 10c along the first direction Z, and a gap Ge12 is provided between the second electrode unit 12 and the lid body 10c. By providing the gaps Ge11 and Ge12, it is possible to house both the first and second electrode units 11 and 12 in the housing unit 10d, without creating a gap between the lid body 10c and the first board 10a. The length of the gap Ge11 and the length of the gap Ge12 may be set to be equal to each other, or may be set to be different from each other. The latter case may take place when, for example, the surface of one of electrode unit is subjected to surface treatment such as coating, surface modification or the like, in order to make the difference between the work function of the first electrode unit 11 and the work function of the second electrode unit 12 bigger. Alternatively, the latter case may take place when the first electrode unit 11 and the second electrode unit 12, which are made of different materials, are formed simultaneously in one etching step.

Figure 9A:
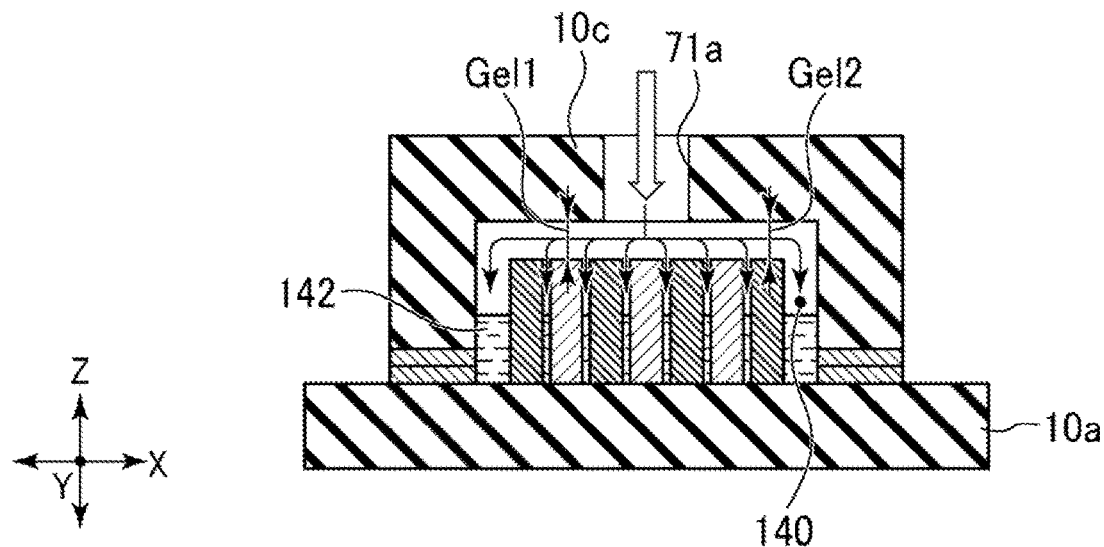
FIGS. 9A and 9B are schematic cross-sectional views to show an example of solvent injection.
Figure 9B:
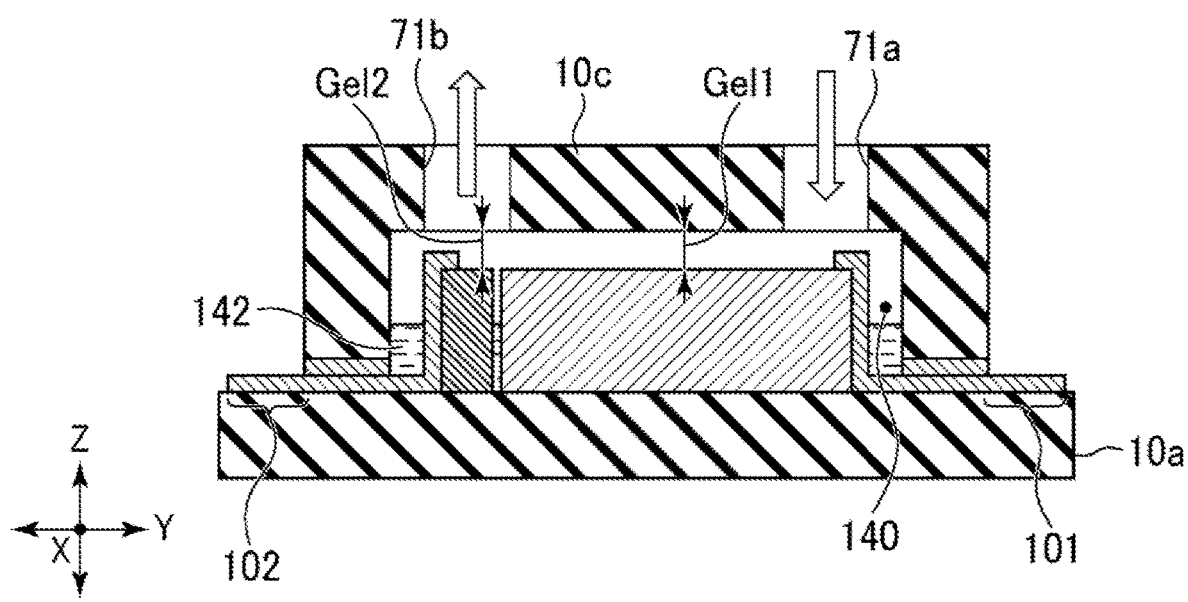

FIGS. 9A and 9B are schematic cross-sectional views to show an example of solvent injection. The schematic cross section shown in FIG. 9A corresponds to the schematic cross section shown in FIG. 6A. The schematic cross section shown in FIG. 9B corresponds to the schematic cross section shown in FIG. 6B.

As shown in FIGS. 9A and 9B, A first filling hole 71a and a second filling hole 71b can be provided in the lid body 10c. The first and second filling holes 71a and 71b are used, for example, to inject the solvent 142 into the gap unit 140. When the first and second filling holes 71a and 71b are used to inject the solvent 142, if the gaps Ge11 and Ge12 were in the gap unit 140, the solvent 142 would pass through the gaps Ge11 and Ge12 and come between the first electrode unit 11 and the second electrode unit 12. By this means, it is possible to provide an advantage that it is possible to easily fill between the first electrode unit 11 and the second electrode unit 12 with the solvent 142.

The solvent 142 is injected in the gap unit 140 from, for example, the first filling hole 71a. In this case, the other second filling hole 71b is used as, for example, an air-vent hole. Furthermore, the solvent 142 may be injected through the first filling hole 71a, while creating a vacuum inside the gap unit 140, through the second filling hole 71b.

As with the first modification, a thermoelectric element 1b having comb tooth-type electrodes can also be used for the thermoelectric element, besides the thermoelectric element 1 having parallel flat plate-type electrodes.

First Embodiment: Second Modification

A second modification relates to a modification of the thermal conductive base.

Figure 10:
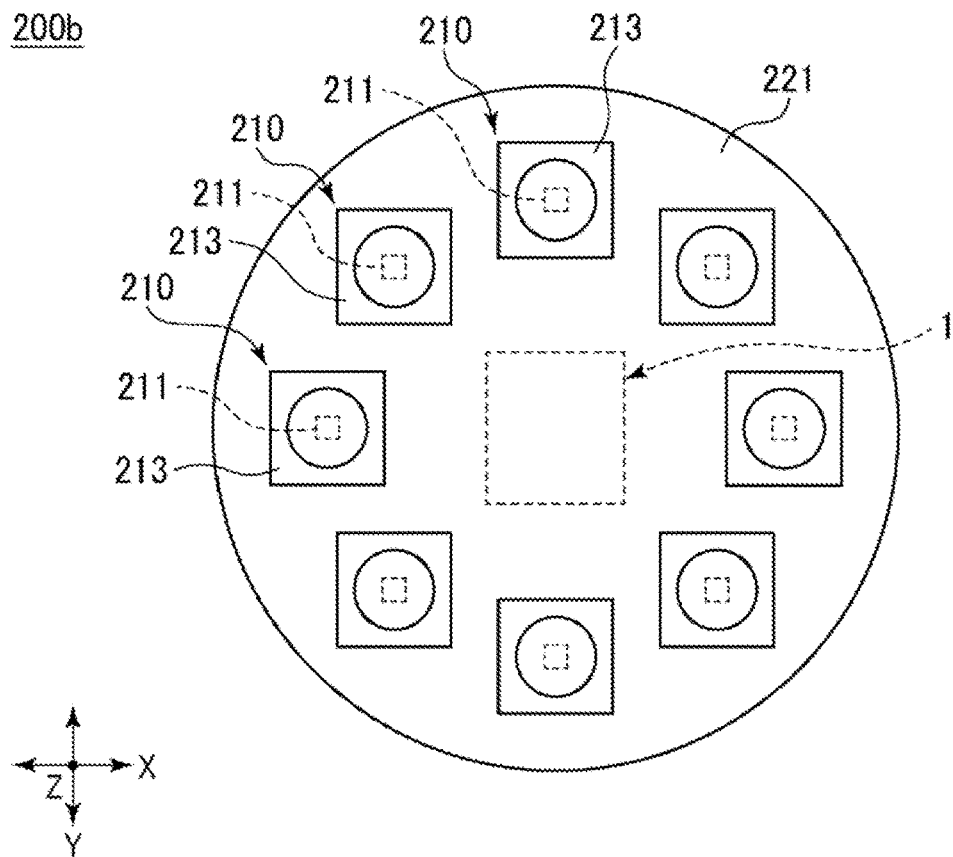
FIG. 10 is a schematic plan view to show a first example of a thermal conductive base.

FIG. 10 is a schematic plan view to show a first example of the thermal conductive base.

As shown in FIG. 10, the planar shape of the thermal conductive base 221 of the light-emitting device 200b according to the second modification when viewed from the first direction Z is, for example, circular. On the circular thermal conductive base 221, a plurality of LED elements 210 are arranged in an annular shape, for example. The number of LED elements 210 to be arranged is unspecified. Furthermore, the arrangement pattern of LEDs is not limited to an annular shape, and is unspecified.

As with the second modification, a thermal conductive base having a circular planar shape can also be used for the thermal conductive base 221.

First Embodiment: Third Modification

Figure 11:
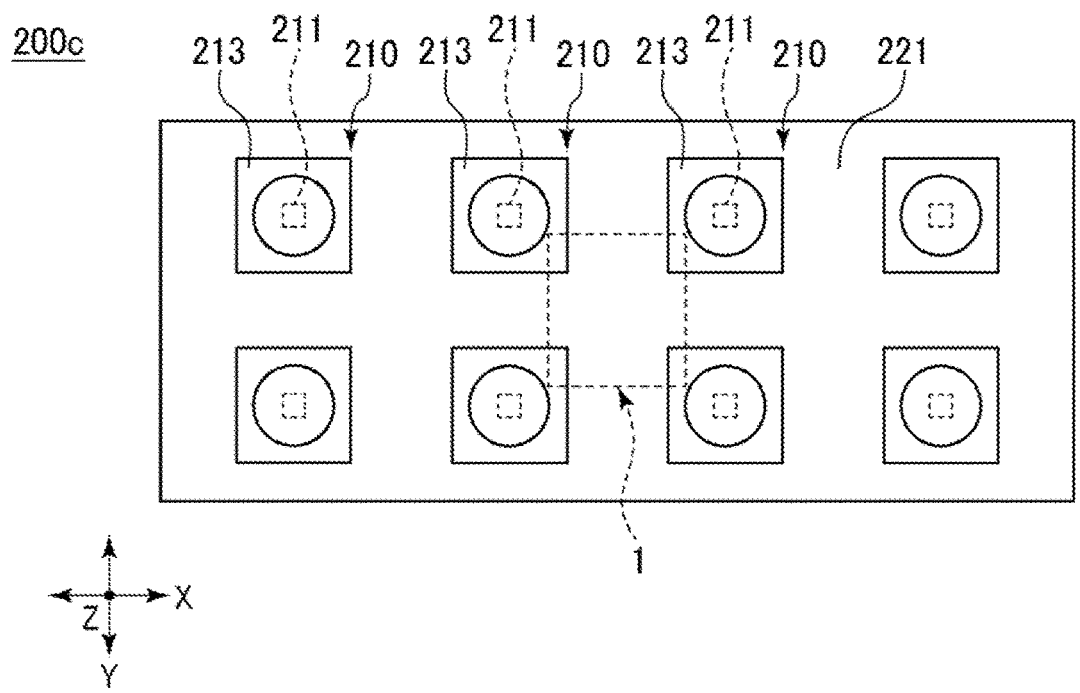
FIG. 11 is a schematic plan view to show a second example of the thermal conductive base.

A third modification relates to a modification of the light-emitting device. FIG. 11 is a schematic plan view to show a second example of the light-emitting device according to the third modification.

As shown in FIG. 11, the planar shape of the thermal conductive base 221 of the light-emitting device 200c according to the third modification when viewed from the first direction Z is rectangular. On the rectangular thermal conductive base 221, a plurality of LED elements 210 are arranged, for example, in a matrix. For example, in the light-emitting device 200c, a plurality of LED elements 210 are arranged in 2 rows×4 columns. In the second modification, again, the number of LED elements 210 arranged is unspecified. Furthermore, the LED arrangement pattern is not limited to an annular shape of 2 rows×4 columns.

As with the third modification, a thermal conductive base having a rectangular planar shape can also be used for the thermal conductive base 221.

First Embodiment: Fourth Modification

Figure 12A:
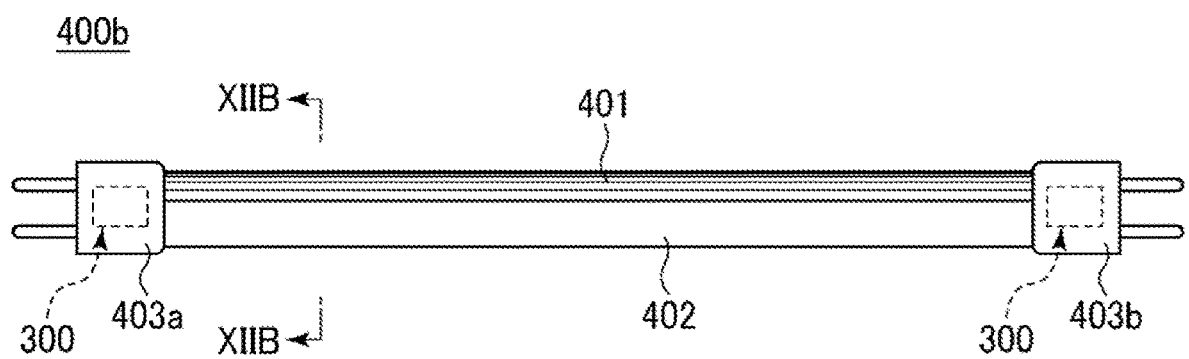
FIG. 12A is a schematic view to show an example of a lighting device according to a first modification.
Figure 12B:
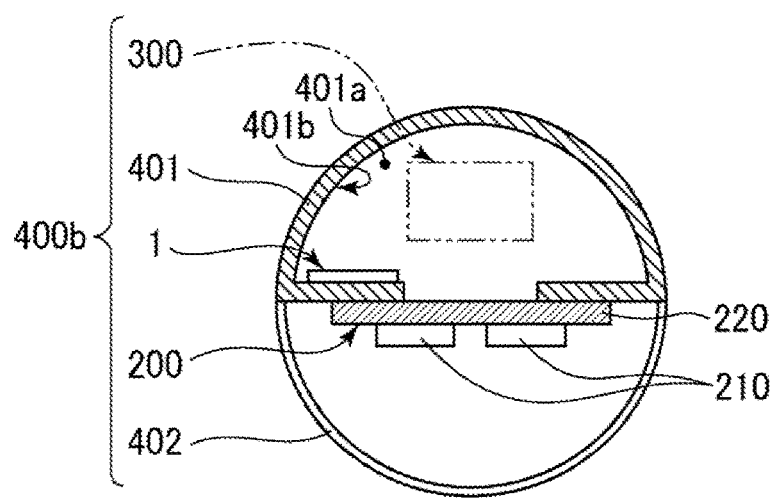
FIG. 12B is a schematic cross-sectional view taken along the line XIIB-XIIB in FIG. 12A.

A fourth modification relates to a modification of the lighting device. FIG. 12A is a schematic view to show an example of the lighting device according to the first modification. FIG. 12B is a schematic cross-sectional view taken along the line XIIB-XIIB in FIG. 12A.

As shown in FIGS. 12A and 12B, the lighting device 400b according to the first modification is a straight tube-type LED lamp. The straight tube-type LED lamp includes a light-emitting device 200, a heat sink 401, a translucent cover 402, a pair of base units 403a and 403b, a thermoelectric element 1, and a power supply circuit 300.

In the straight tube-type LED lamp, too, the heat sink 401 is provided on the open surface 221b. With the straight tube-type LED lamp, the power supply circuit 300 is housed in, for example, at least one of the base units 403a and 403b, or in the hollow unit 401a. The thermoelectric element 1 is provided on the inner surface 401b of the hollow unit 401a of the heat sink 401. By this means, like the lighting device 400, the thermoelectric element 1 is housed inside the hollow unit 401a of the heat sink 401.

Like the lighting device 400b, the lighting device may be, for example, a straight tube-type LED lamp.

Note that examples of lighting devices include a light bulb-type LED lamp, a straight tube-type LED lamp, and, furthermore, a backlight for use for lighting displays. In addition, the lighting devices include lighting equipment. Examples of lighting equipment include LED downlights, LED spotlights, LED floodlights, LED street lights, LED base lights, LED ceiling lights and so forth. In this way, the lighting device 400 can be applied to various types of lighting.

Second Embodiment

Figure 13:
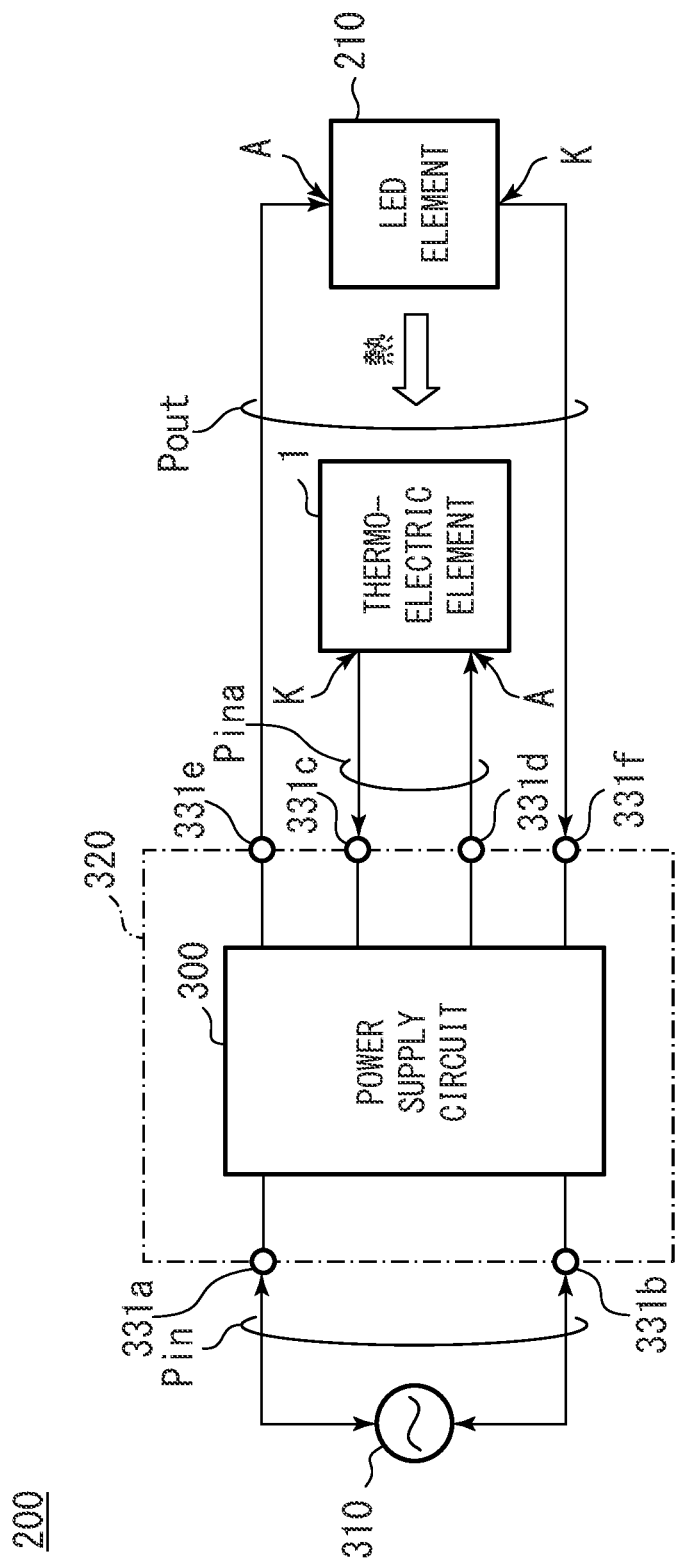
FIG. 13 is a schematic block diagram to show an example of a lighting device with an electric power generation function according to a second embodiment.

A second embodiment relates to an example of a power supply circuit that can be used in a lighting device according to the first embodiment. FIG. 13 is a schematic block diagram to show an example of a lighting device with an electric power generation function according to the second embodiment.

As shown in FIG. 13, the power supply circuit 300 is provided on, for example, the circuit board 320. For example, the first outer terminal 331a to the sixth outer terminal 331f are provided on the circuit board 320. The first outer terminal 331a and the second outer terminal 331b are electrically connected with an external power supply, which is, for example, a commercial power supply 310. By this means, external input power Pin is input to the power supply circuit 300 via the first and second outer terminals 331a and 331b. The third outer terminal 331c and the fourth outer terminal 331d are electrically connected with the thermoelectric element 1. By this means, auxiliary input power Pina is input to the power supply circuit 300 via the third and fourth outer terminals 331c and 331d. The third outer terminal 331c is electrically connected with the cathode K of the thermoelectric element 1. The fourth outer terminal 331d is electrically connected with the anode A of the thermoelectric element 1. The fifth outer terminal 331e and the sixth outer terminal 331f are electrically connected with the LED element 210. By this means, the power supply circuit 300 outputs LED input power Pout via the fifth and sixth outer terminals 331e and 331f. The fifth outer terminal 331e is electrically connected with the anode A of the LED element 210. The sixth outer terminal 331f is electrically connected with the cathode K of the LED element 210.

Figure 14:
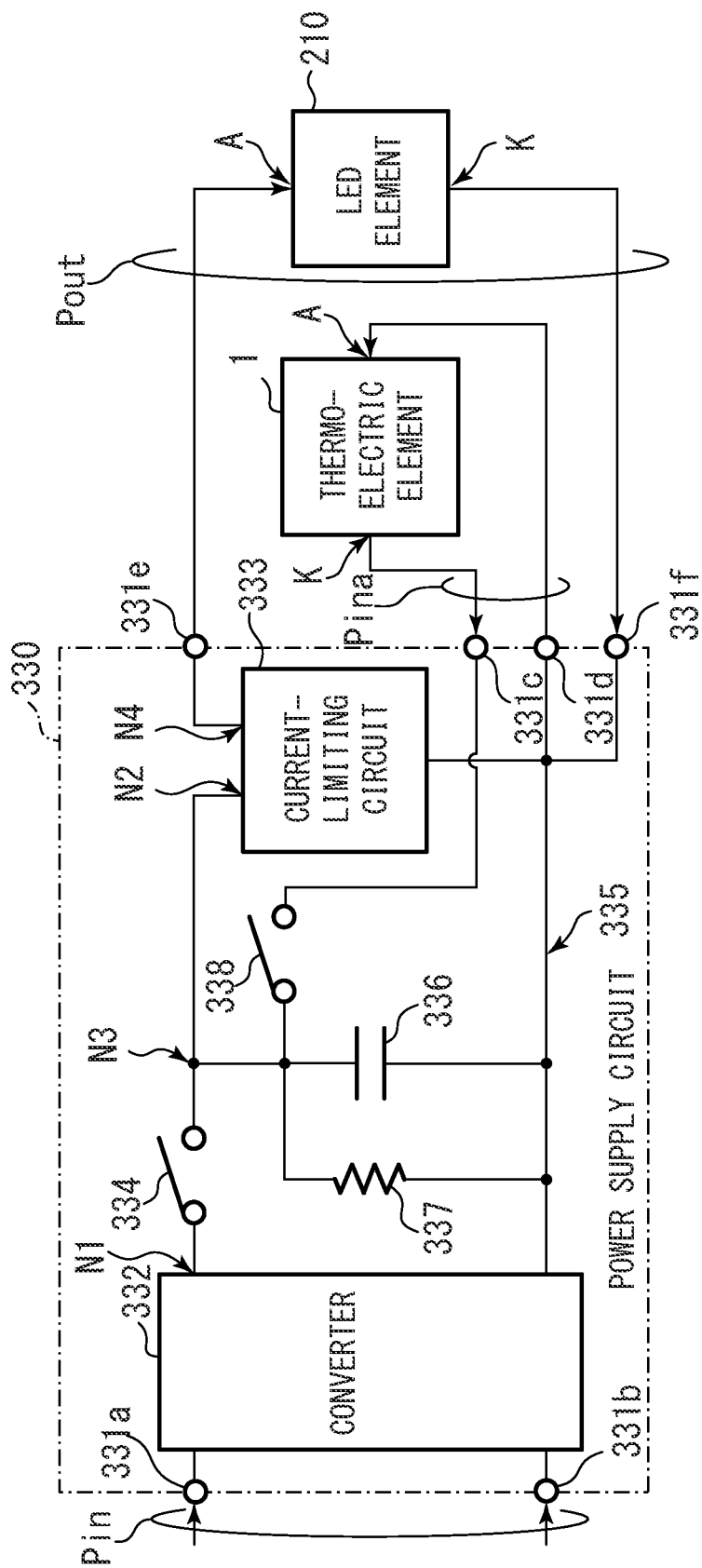
FIG. 14 is a schematic circuit diagram to show an example of the lighting device with an electric power generation function according to the second embodiment.

FIG. 14 is a schematic circuit diagram to show an example of the lighting device with an electric power generation function according to the second embodiment. As shown in FIG. 14, the power supply circuit 300 includes a converter 332. When the external power supply is the commercial power supply 310, the converter 332 becomes an AC-DC converter (rectifier circuit). When the external power supply is a battery, the converter 332 becomes a DC-DC converter. When the converter 332 is an AC-DC converter, alternating-current power is rectified to direct-current power. The rectified direct-current power is supplied to the current-limiting circuit 333. The current-limiting circuit 333 limits the direct current to generate and output LED input power Pout.

The higher potential-side output node N1 of the converter 332 is electrically coupled with the higher potential-side input node N2 of the current-limiting circuit 333 via the first switch 334. The connection node N3 between the first switch 334 and the higher potential-side input node N2 is electrically coupled with the lower potential-side wiring 335 of the power supply circuit 300 via the capacitor 336. The capacitor 336 is a smoothing capacitor. Furthermore, a resistor 337 is connected to the capacitor 336 in parallel. The resistor 337 is a discharge resistor. The connection node N3 is electrically coupled with the cathode K of the thermoelectric element 1 via the second switch 338. For the first and second switches 334 and 338, for example, transistors are used. The higher potential-side output node N4 of the current-limiting circuit 333 is electrically coupled with the anode A of the LED element 210. The cathode K of the LED element 210 and the anode A of the thermoelectric element 1 are electrically coupled with the lower potential-side wiring 335.

When lighting the light-emitting device 200, the first switch 334 is turned on, and the second switch 338 is turned off. The higher potential-side output node N1 is electrically connected with one electrode of the capacitor 336, and the capacitor 336 is charged. After the charging of the capacitor 336 is completed, the higher potential-side output node N1 is electrically connected with the higher potential-side input node N2. The converter 332 supplies current to the current-limiting circuit 333. The current-limiting circuit 333 limits the supplied current to generate and output LED input power Pout. By this means, the LED element 210 is lit.

When the LED element 210 lights up, the LED element 210 generates heat. The heat is transferred to the thermoelectric element 1. Eventually, the thermoelectric element 1 is in a state in which the thermoelectric element 1 can generate electric power—for example, a state in which the thermoelectric element 1 can generate a current that can charge the capacitor 336. After the thermoelectric element 1 is ready to generate electric power, the second switch 338 is turned on. The cathode K of the thermoelectric element 1 is electrically connected with one electrode of the capacitor 336. The thermoelectric element 1 supplies a current to the current-limiting circuit 333, together with the converter 332. By this means, the LED element 210 keeps being lit.

Furthermore, using the first switch 334 and the second switch 338, it is possible to choose to couple either the higher potential-side output node N1 or the cathode K of the thermoelectric element 1 to one electrode of the capacitor 336.

For example, when lighting the light-emitting device 200, the first switch 334 is turned on and the second switch 338 is turned off, to light the light-emitting device 200 using the external input power Pin. The state of being lit using the external input power Pin is referred to as "normal energy mode", for convenience.

After the light-emitting device 200 is lit, for example, once the thermoelectric element 1 is in a state in which the thermoelectric element 1 can generate a current that can charge the capacitor 336, the first switch 334 is turned off, and the second switch 338 is turned off. The power supply source switches from the external input power Pin to the auxiliary input power Pina. By this means, the operation mode of the light-emitting device switches from normal energy mode to energy saving mode, in which the auxiliary input power Pina from the thermoelectric element 1 is used. Normal energy mode can switch to energy saving mode automatically or manually. Energy saving mode generally means making the brightness of the light-emitting device 200 lower, and reducing the power consumption of a commercial power supply or a battery. However, the energy saving mode in the fourth embodiment means switching to auxiliary input power Pin, which is different from normal energy mode. Consequently, even in energy saving mode, the decline of the brightness of the light-emitting device 200 is reduced.

Furthermore, as for the capacitor 336, a smoothing capacitor provided in the power supply circuit 300 can also be used. When a smoothing capacitor is used, the thermoelectric element 1 can be connected with the power supply circuit 300 by using existing circuit elements in the power supply circuit 300. By this means, it is possible to prevent the number of circuit elements and electronic components 330 required for the power supply circuit 300 from increasing.

Second Embodiment: First Modification

Figure 15:
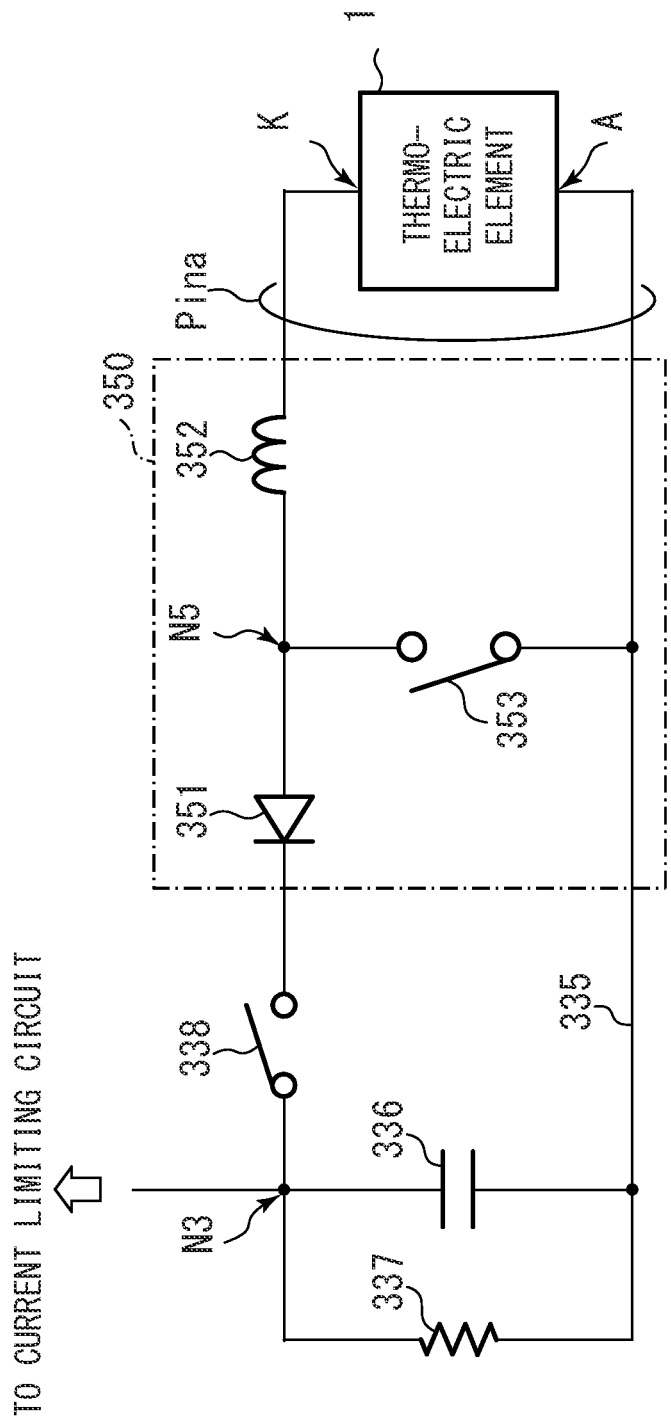
FIG. 15 is a schematic circuit diagram to show an example of a lighting device with an electric power generation function according to a first modification of the second embodiment.

FIG. 15 is a schematic circuit diagram to show an example of a light-emitting device with an electric power generation function according to a first modification of the second embodiment. Cases might occur where the electric power generated by the thermoelectric element 1 cannot secure a sufficient voltage for lighting the LED element 210. In this case, the thermoelectric element 1 may be connected with the power supply circuit 300 via a booster circuit 350. FIG. 18 shows a schematic circuit showing an example of the booster circuit 350.

As shown in FIG. 15, the booster circuit 350 includes, for example, a diode 351, a coil 352, and a third switch 353. The cathode of the diode 351 is electrically coupled with one electrode of the capacitor 336 via a second switch 338. The anode of the diode 351 is electrically coupled with the cathode K of the thermoelectric element 1 via the coil 352. The coil 352 is a choke coil. The connection node N5 between the anode of the diode 351 and the coil 352 is electrically coupled with the lower potential-side wiring 335 via the third switch 353. For the third switch 353, for example, a transistor is used.

The operation of the booster circuit 350 boosts the voltage of the auxiliary input power Pina in the following manner. First, the second switch 338 is turned on to electrically couple the cathode K of the thermoelectric element 1 with one electrode of the capacitor 336. In this state, the third switch 353 is turned on. A current flow from the cathode K of the thermoelectric element 1 to the lower potential-side wiring 335, via the coil 352. Then, the third switch 353 is turned off. The current from the coil 352 does not become zero immediately. Consequently, a current flow from the coil 352 to the connection node N3 at once, via the diode 351 and the second switch 338. The diode 351 prevents backflow of current from the connection node N3. By repeating turning on and off the third switch 353 in this way, the voltage of the auxiliary input power Pina is boosted.

In this way, the thermoelectric element 1 may be connected with the power supply circuit 300 via the booster circuit 350. Note that the booster circuit is not limited to the booster circuit 350 shown in FIG. 12. A well-known booster circuit such as a transformer can be used for the booster circuit. Furthermore, the booster circuit can be provided in the power supply circuit 300.

Second Embodiment: Second Modification

As shown in FIG. 14, the anode A of an LED element 210 is electrically coupled with one electrode of the capacitor 336 via the current-limiting circuit 333. By limiting current to flow to the LED element 210 by means of the current-limiting circuit 333, the LED element 210 can adjust its light. The luminous efficiency of the LED element 210 declines as the temperature of the LED chip 211 rises. When the light is adjusted by the current-limiting circuit 333 so that the brightness of the LED element 210 drops, it is possible to prevent the temperature of the LED chip 211 from increasing, and prevent the luminous efficiency from declining.

Furthermore, the electric power generation efficiency of the thermoelectric element 1 improves as the temperature around each of the first and second electrode units 11 and 12 rises. So, the current-limiting circuit 333 limits the current to flow to the LED element 210 so that the temperature around the LED element 210 is maintained in a temperature range in which a good balance is maintained between the luminous efficiency of the LED element 210 and the electric power generation efficiency of the thermoelectric element 1.

Figure 16:
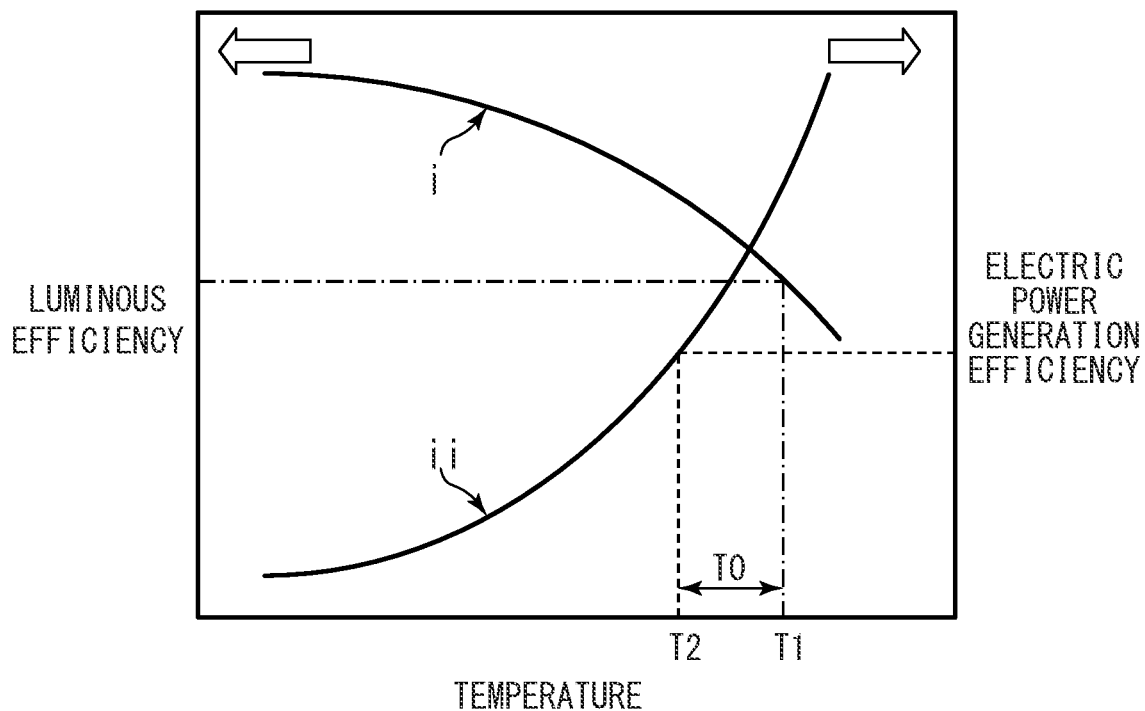
FIG. 16 is a schematic view to schematically show the relationship between temperature and luminous efficiency, and the relationship between temperature and electric power generation efficiency.

FIG. 16 is a schematic view to schematically show the relationship between temperature and luminous efficiency, and the relationship between temperature and electric power generation efficiency. The line "i" in FIG. 16 shows the relationship between the temperature of the LED element 210 and luminous efficiency. The line "ii" in FIG. 16 shows the relationship between the temperature of the thermoelectric element 1 and electric power generation efficiency.

As shown in FIG. 16, the LED element 210 has, for example, a temperature which the luminous efficiency of the LED element 210 is not allowed to cross and go down below, or a temperature T1 which the temperature of the LED element 210 is not allowed to cross and rise above. Furthermore, the thermoelectric element 1 has, for example, a temperature at which, in actual use, sufficient electric power generation is enabled, or a temperature T2 at which, in actual use, the efficiency of electric power generation equals or surpasses the desired level of electric power generation efficiency. The temperature around the LED element 210 is preferably maintained in a temperature range T0, where the temperature T1 is the upper limit and the temperature T2 is the lower limit, for example.

For example, the temperature around the LED element 210 is detected by using a temperature sensor or the like. This detection result is fed back to the current-limiting circuit 333, for example, as a control signal. Based on this feedback control signal, the current-limiting circuit 333 limits the current to flow to the LED element 210 so that the temperature around the LED element 210 is maintained, for example, in the temperature range T0.

The power supply circuit 300 is placed around the LED element 210. Consequently, the temperature sensor can be provided in the power supply circuit 300. An example of the temperature sensor is a thermistor. A thermistor is an element whose resistance value increases following the rise of temperature. The temperature around the LED element 210 can be detected by using, for example, a thermistor.

Figure 17:
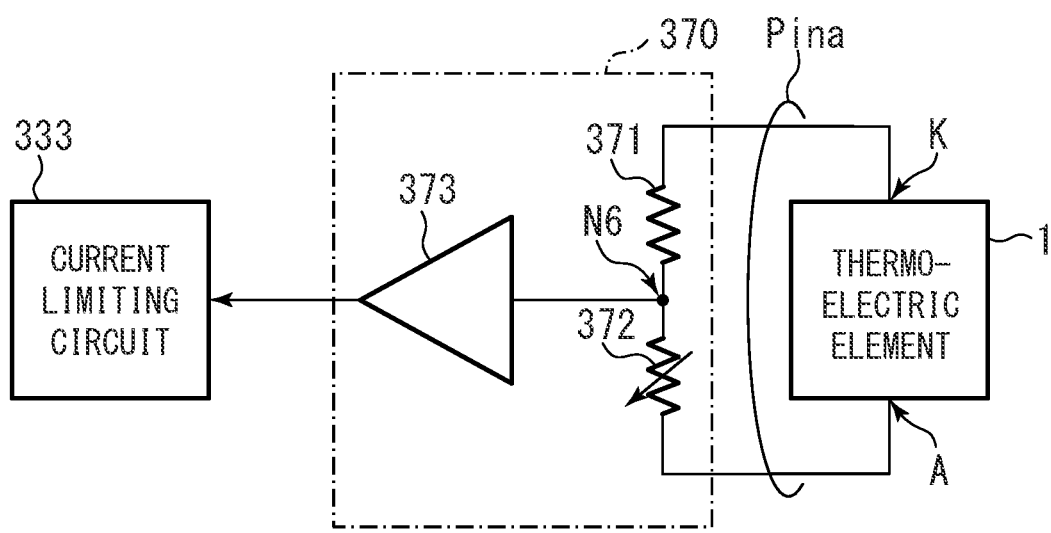
FIG. 17 is a schematic circuit diagram to show an example of a lighting device with an electric power generation function according to a second modification of the second embodiment.

FIG. 17 is a schematic circuit diagram to show an example of the light-emitting device with an electric power generation function according to the second modification of the fourth embodiment.

As shown in FIG. 20, a temperature detection circuit 370 includes a resistor 371, a thermistor 372, and a detection circuit 373. One end of the resistor 371 is electrically coupled with the cathode K of the thermoelectric element 1. One end of the thermistor 372 is electrically coupled with the anode A of the thermoelectric element 1. The connection node N6 between the other end of the resistor 371 and the other end of the thermistor 372 is electrically coupled with the input terminal of the detection circuit 373. The output terminal of the detection circuit 373 is electrically coupled with the current-limiting circuit 333. The detection circuit 373 outputs a control signal S to the current limit circuit 333.

The resistance value of the thermistor 372 increases as the temperature around the LED element 210 rises. Consequently, the voltage of the connection node N6 increases following the rise of the temperature around the LED element 210. The detection circuit 373 detects the voltage of the connection node N6.

The detection circuit 373 enables the control signal S to be output to the current-limiting circuit 333 when the temperature around the LED element 210 rises and the voltage of the connection node N6 becomes equal to or higher than the set value. By this means, the current-limiting circuit 333 limits the current to flow to the LED element 210. The detection circuit 373 disables the control signal S to output to the current-limiting circuit 333 when the temperature around the LED element 210 drops and the voltage of the connection node N6 falls below the set value. By this means, the current-limiting circuit 333 removes the limitation on the current to flow to the LED element 210. When the temperature around the LED element 210 rises again and the voltage of the connection node N6 becomes equal to or higher than the set value, the control signal S to output to the current-limiting circuit 333 is enabled again.

In this way, the detection circuit 373 repeats enabling and disabling the control signal S following changes of the resistance value in the thermistor 372. By this means, the temperature around the LED element 210 can be maintained, for example, in the temperature zone T0. As a result of this, for example, it is possible to prevent the temperature around the LED element 210 from increasing and prevent the luminous efficiency of the LED element 210 from decreasing, simultaneously, while still ensuring a sufficient amount of electric power generation in the thermoelectric element 1, simultaneously.

Furthermore, the temperature detection circuit 370 uses the input auxiliary power Pina from the thermoelectric element 1 as a power supply. For example, the temperature detection circuit 370 to use the thermistor 372 keeps flowing a current while the LED element 210 is lit, in order to detect the temperature around the LED element 210. This consumes external input power from commercial power supplies and batteries. In this regard, by using the input auxiliary voltage Pina as a power supply for the temperature detection circuit 370, it is possible to reduce the consumption of external input power. Consequently, with the temperature detection circuit 370, it is possible to have the advantage that a temperature detection circuit having lower power consumption can be provided.

Although some of the embodiments of the present invention have been described above, these embodiments are presented simply as examples, and are by no means intended to limit the scope of the present invention. For example, these embodiments can be implemented in appropriate combinations. Furthermore, the present invention can be implemented in various novel forms apart from the several embodiments described above. Consequently, each of the several embodiments described above can be omitted, replaced, or changed in a variety of ways without departing from the gist of the present invention. Such novel forms and modifications are included in the scope and gist of the present invention, as well as in the scope of the invention recited in the claims and any equivalent of the invention recited in the claims.

REFERENCE SIGNS LIST 1, 1b: thermoelectric element
10: casing unit

10a: first board
10af: first main surface
10ab: second main surface
10b: second board
10c: lid body
10d: housing unit
11: first electrode unit
11a: first electrical contact
12: second electrode unit
12a: second electrical contact
13a: first support unit
13aa: board joining surface
13b: second support unit
13ba: board joining surface
13c: third support unit
13ca: board joining surface
14: middle unit
140: gap unit
141: nanoparticles
142: solvent
15a: first connection wiring
16a: second joining metal
17a, 17b: slit
18a: first connection wiring
18b: second connection wiring
30: adhesive member
31a, 31b: sealing member
101, 102: first outer casing terminal, second outer casing terminal
200, 200b, 200c: light-emitting device
210: LED element
211: LED chip
212: package board
213: reflector
214: translucent enclosing resin
215a: first electrode wiring
215b: second electrode wiring
220: thermal conductive LED board
221: thermal conductive base
221a: mounting surface
221b: open surface
222a: first board wiring
222b: second board wiring
223: insulator
300: power supply circuit
310: commercial power supply
320: circuit board
321a to 321f: first to sixth lead wires
330: electronic component
331a to 331f: first to sixth outer terminals
332: converter
333: current limiting circuit
334: first switch
335: lower potential-side wiring
336: capacitor
337: resistor
338: second switch
350: booster circuit
351: diode
352: coil
353: third switch
370: temperature detection circuit
371: resistor
372: thermistor
373: detection circuit
400, 400b: lighting device
401: heat sink
401a: hollow unit
402b: inner surface
402: translucent cover
403, 403a, 403b: base unit
410: shell
411: eyelet
Pin: external input power
Pina: auxiliary input power
Pout: LED input power
A: anode
K: cathode
G: inter-electrode gap
Gx: inter-electrode gap
Gy: inter-electrode gap
Ge11: first electrode—lid body gap
Ge12: second electrode—lid body gap
N1 to N5: node
T0: temperature range
T1, T2: temperature
S: control signal
X: second direction
Y: third direction
Z: first direction

The invention claimed is:

1. A lighting device with an electric power generation function, comprising:
    a light-emitting device, comprising a thermal conductive LED board, including a thermal conductive base having a mounting surface and an open surface opposite from the mounting surface, and a board wiring provided on the mounting surface so as to be electrically insulated from the thermal conductive base, and an LED element electrically connected with the board wiring, the LED element being configured to convert electric energy into light energy;
    a heat sink, having a hollow unit inside, provided on the open surface of the thermal conductive base so as to be electrically insulated from the thermal conductive base, and thermally coupled with the thermal conductive base;
    a translucent cover, provided on the heat sink, and housing the lighting device; and
    a thermoelectric element, provided in the hollow unit of the heat sink, electrically insulated from the heat sink, and thermally coupled with the heat sink, the thermoelectric element being configured to convert thermal energy released from the LED element into electric energy,
    wherein the thermoelectric element includes:
        a casing unit having a housing unit,
        a first electrode unit provided inside the housing unit,
        a second electrode unit provided inside the housing unit, separated from and opposing the first electrode unit in a first direction, and having a work function different from a work function of the first electrode unit, and
        a middle unit provided between the first electrode unit and the second electrode unit, and including a nanoparticle having a work function between the work function of the first electrode unit and the work function of the second electrode unit, in the housing unit, and
    wherein the casing unit is provided on an inner surface of the hollow unit of the heat sink.

2. The lighting device with the electric power generation function according to claim 1, further comprising:

a first connection wiring, electrically connected with the first electrode unit, and leading to outside of the housing unit; and a second connection wiring, electrically connected with the second electrode unit, and leading to the outside of the housing unit, wherein a first electrical contact between the first electrode unit and the first connection wiring and a second electrical contact between the second electrode unit and the second connection wiring are both provided inside the housing unit.

3. The lighting device with the electric power generation function according to claim 2, wherein the casing unit includes a first board having a first main surface and a second main surface opposite from the first main surface and facing the open surface of the thermal conductive base, wherein the casing unit further comprises a first outer terminal, electrically connected with the first connection wiring, and a second outer terminal, electrically connected with the second connection wiring, and wherein the first outer terminal and the second outer terminal are both provided on the first main surface of the first board.

4. The lighting device with the electric power generation function according to claim 1, wherein the thermoelectric element includes at least one of a parallel flat plate-type thermoelectric element and a comb tooth-type thermoelectric element.

5. The lighting device with the electric power generation function according to claim 1, further comprising a power supply circuit, capable of receiving as input each of external input power supplied from outside and auxiliary input power supplied from the thermoelectric element, converting each of the external input power and the auxiliary input power into LED input power, and outputting the LED input power to the LED element.

6. The lighting device with the electric power generation function according to claim 5, wherein the power supply circuit includes a capacitor having one electrode and another electrode, wherein the one electrode is electrically coupled with each of a higher potential-side output node of the external input power, an anode of the LED element, and a cathode of the thermoelectric element, and wherein the other electrode is electrically coupled with a lower potential-side wiring of the power supply circuit.

7. The lighting device with the electric power generation function according to claim 6, wherein the power supply circuit further includes a first switch, a second switch, and a current-limiting circuit, wherein the higher potential-side output node is electrically coupled with the one electrode via the first switch, wherein the cathode of the thermoelectric element is electrically coupled with the one electrode via the second switch, and wherein the anode of the LED element is electrically coupled with the one electrode via the current-limiting circuit.

\* \* \* \* \*